(12) United States Patent
Kim et al.

(10) Patent No.: US 11,495,542 B2
(45) Date of Patent: Nov. 8, 2022

(54) SEMICONDUCTOR MEMORY DEVICE AND METHOD OF FABRICATING THE SAME

(71) Applicant: Samsung Electronics Co., Ltd., Suwon-si (KR)

(72) Inventors: Jiyoung Kim, Hwaseong-si (KR); Woosung Yang, Gwangmyeong-si (KR); Jungsok Lee, Hwaseong-si (KR); Byungjin Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 55 days.

(21) Appl. No.: 16/875,174

(22) Filed: May 15, 2020

(65) Prior Publication Data

US 2021/0035910 A1    Feb. 4, 2021

(30) Foreign Application Priority Data

Jul. 30, 2019   (KR) ......................... 10-2019-0092568

(51) Int. Cl.

| H01L 27/11582 | (2017.01) |
|---|---|
| H01L 23/535 | (2006.01) |
| H01L 27/11524 | (2017.01) |
| H01L 27/11556 | (2017.01) |
| H01L 27/11529 | (2017.01) |
| H01L 27/11519 | (2017.01) |
| H01L 21/768 | (2006.01) |
| H01L 27/11573 | (2017.01) |

(Continued)

(52) U.S. Cl.
CPC ...... *H01L 23/535* (2013.01); *H01L 21/76805* (2013.01); *H01L 21/76895* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
CPC ......... H01L 27/11551; H01L 27/11556; H01L 27/11578; H01L 27/11582
See application file for complete search history.

(56) References Cited

U.S. PATENT DOCUMENTS

| 9,401,309 B2 | 7/2016 | Izumi et al. |
| 9,524,983 B2 | 12/2016 | Lee et al. |
| 9,673,213 B1 | 6/2017 | Yu et al. |

(Continued)

*Primary Examiner* — Christopher A Johnson
(74) *Attorney, Agent, or Firm* — Harness, Dickey & Pierce, P.L.C.

(57) ABSTRACT

A semiconductor memory includes electrode structures that each includes horizontal electrodes stacked on each other a substrate, vertical electrodes between the electrode structures and extending along the horizontal electrodes, first contacts connected to the horizontal electrodes at end portions of the electrode structures, second contacts connected to upper portions of the vertical electrodes, and a first interconnection structure connected to top surfaces of the second contacts. The first interconnection structure includes first and second sub-interconnection lines. The sub-interconnection lines extend in a first direction and contact the top surfaces of the second contacts. The second sub-interconnection lines extended in a second direction crossing the first direction and contact the first sub-interconnection lines.

20 Claims, 21 Drawing Sheets

(51) Int. Cl.
*H01L 27/11565* (2017.01)
*H01L 27/1157* (2017.01)

(56) References Cited

U.S. PATENT DOCUMENTS

| | | |
|---|---|---|
| 9,748,261 B2 | 8/2017 | Lee et al. |
| 9,780,096 B2 | 10/2017 | Park et al. |
| 2014/0042519 A1* | 2/2014 | Lee ................. H01L 29/423 257/324 |
| 2017/0323900 A1 | 11/2017 | Kanamori et al. |
| 2018/0294225 A1 | 10/2018 | Lee et al. |
| 2018/0358374 A1* | 12/2018 | Kim ................. H01L 27/11565 |
| 2019/0067314 A1 | 2/2019 | Lu et al. |

* cited by examiner

SEMICONDUCTOR MEMORY DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2019-0092568, filed on Jul. 30, 2019, in the Korean Intellectual Property Office, the entire contents of which are hereby incorporated by reference.

BACKGROUND

The present disclosure relates to a semiconductor device and a method of fabricating the same, and in particular, to a three-dimensional nonvolatile memory device.

Higher integration of semiconductor devices is required to satisfy demands for superior performance and inexpensive prices. In the case of semiconductor memory devices, since integration is an important factor in determining product prices, increased integration is especially desirable. In the case of conventional two-dimensional semiconductor memory devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional semiconductor memory devices.

SUMMARY

An embodiment of inventive concepts provides a semiconductor device, which includes interconnection structures capable of easily connecting vertical electrodes to each other.

According to an embodiment of inventive concepts, a semiconductor memory device may include a substrate; a plurality of electrode structures on the substrate, where each of the plurality of electrode structures may include horizontal electrodes stacked on each other on the substrate; vertical electrodes between the electrode structures and extending along the horizontal electrodes; first contacts connected to the horizontal electrodes at end portions of the plurality of electrode structures; second contacts connected to upper portions of the vertical electrodes; and a first interconnection structure connected to top surfaces of the second contacts, the first interconnection structure including first sub-interconnection lines and second sub-interconnection lines. The first sub-interconnection lines may extend in a first direction and contact the top surfaces of the second contacts. The second sub-interconnection lines may extend in a second direction crossing the first direction. The second sub-interconnection lines may be in contact with the first sub-interconnection lines.

According to an embodiment of inventive concepts, a semiconductor memory device may include a substrate; a plurality of electrode structures on the substrate, where each of the plurality of electrode structures may include horizontal electrodes stacked on each other on the substrate; vertical electrodes between the electrode structures and extending along the horizontal electrodes and extending in a first direction; first contacts connected to the horizontal electrodes at end portions of the plurality of electrode structures; second contacts connected to upper portions of the vertical electrodes, where top surfaces of the second contacts may be positioned at substantially a same level as the top surfaces of the first contacts, and a separation distance between the second contacts in the first direction may be greater than a separation distance between the first contacts in the first direction; and a first interconnection structure connected to top surfaces of the second contacts.

According to an embodiment of inventive concepts, a semiconductor memory device may include a substrate including a cell array region and a peripheral circuit region; a plurality of electrode structures on the substrate, where each of the plurality of electrode structures include horizontal electrodes stacked on each other on the substrate; a peripheral transistor in the peripheral circuit region; vertical structures penetrating the electrode structures; studs connected to upper portions of the vertical structures; vertical electrodes between the plurality of electrode structures, where the vertical electrodes extend along the horizontal electrodes and in a first direction; first contacts connected to the horizontal electrodes at end portions of the plurality of electrode structures; second contacts connected to upper portions of the vertical electrodes; extension pads connected to top surfaces of the first contacts; third contacts connected to the peripheral transistor, where top surfaces of the third contacts may be positioned at a same level as the top surfaces of the first contacts and top surfaces of the second contacts; peripheral pads connected to top surfaces of the third contacts; a first interconnection structure connected to top surfaces of the second contacts, where a top surface of the first interconnection structure may be positioned at substantially a same level as top surfaces of the extension pads and top surfaces of the peripheral pads; and a second interconnection structure on the first interconnection structure and connected to the first interconnection structure through first vias, where a top surface of the second interconnection structures may be positioned at substantially a same level as top surfaces of the studs.

According to an embodiment of inventive concepts, a method of fabricating a semiconductor memory device may include forming a plurality of electrode structures on a substrate, where each of plurality of electrode structures may include horizontal electrodes sequentially stacked on each other on the substrate; forming vertical structures that penetrate the electrode structures and include channel patterns; forming vertical electrodes between the plurality of electrode structures, where the vertical electrodes extend along the horizontal electrodes; forming first contacts connected to the horizontal electrodes at end portions of the plurality of electrode structures; and forming second contacts that connect to upper portions of the vertical electrodes. The forming the second contacts and the forming the first contacts may be performed concurrently.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Example embodiments of inventive concepts will now be described more fully with reference to the accompanying drawings, in which example embodiments are shown.

Figure 1:
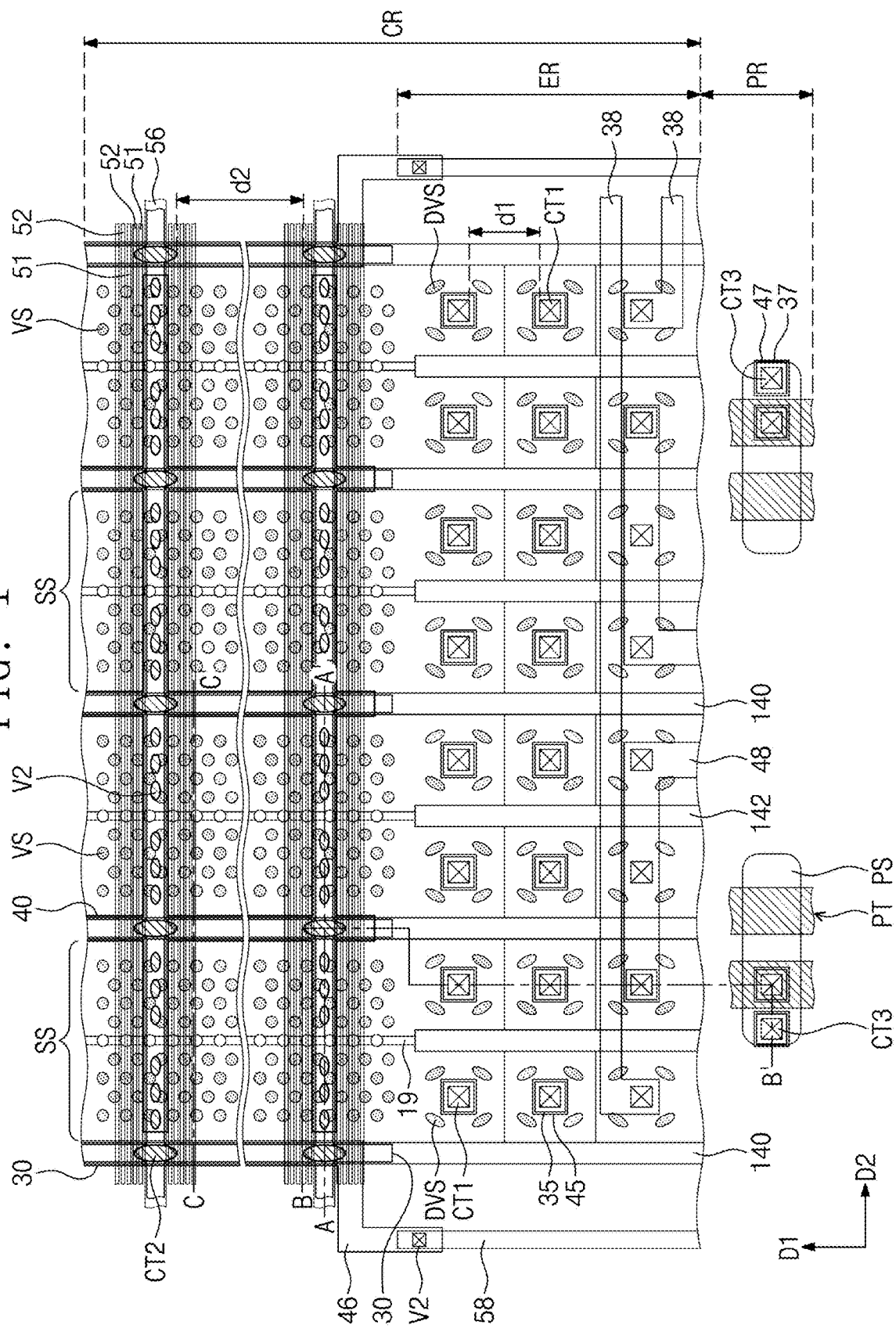
FIG. 1 is a plan view illustrating a semiconductor memory device according to an embodiment of inventive concepts.
Figure 2:
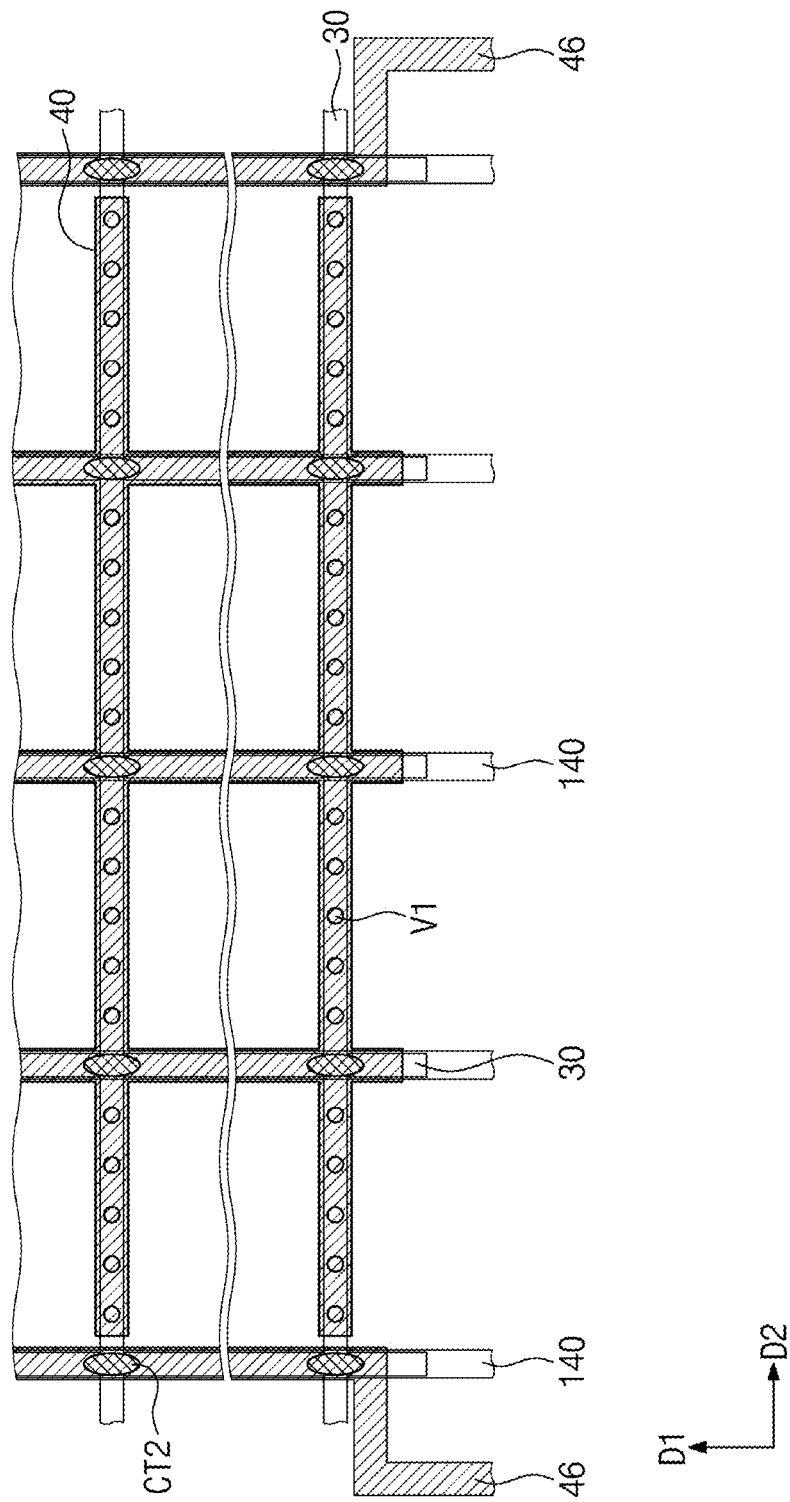
FIG. 2 is a plan view illustrating a first interconnection structure and a second interconnection structure.
Figure 3:
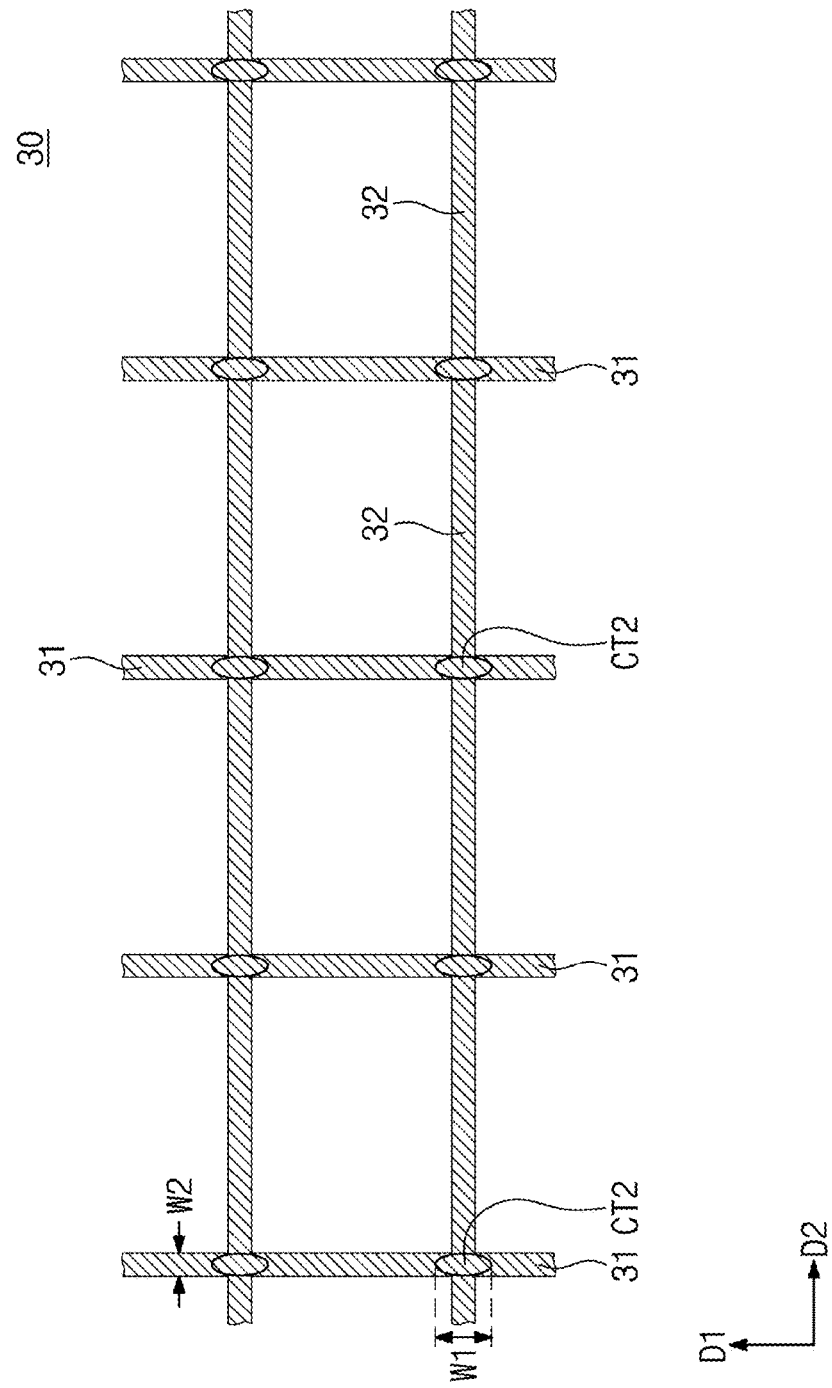
FIG. 3 is a plan view of the first interconnection structure.
Figure 4:
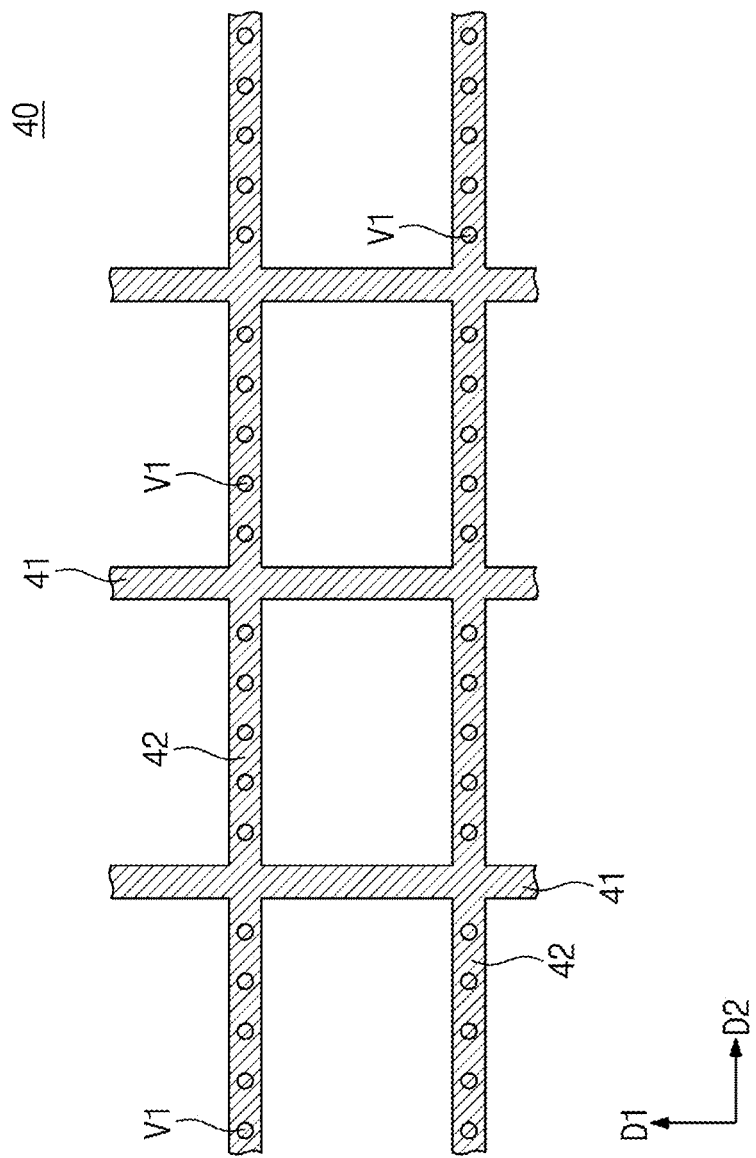
FIG. 4 is a plan view of the second interconnection structure.
Figure 5A:
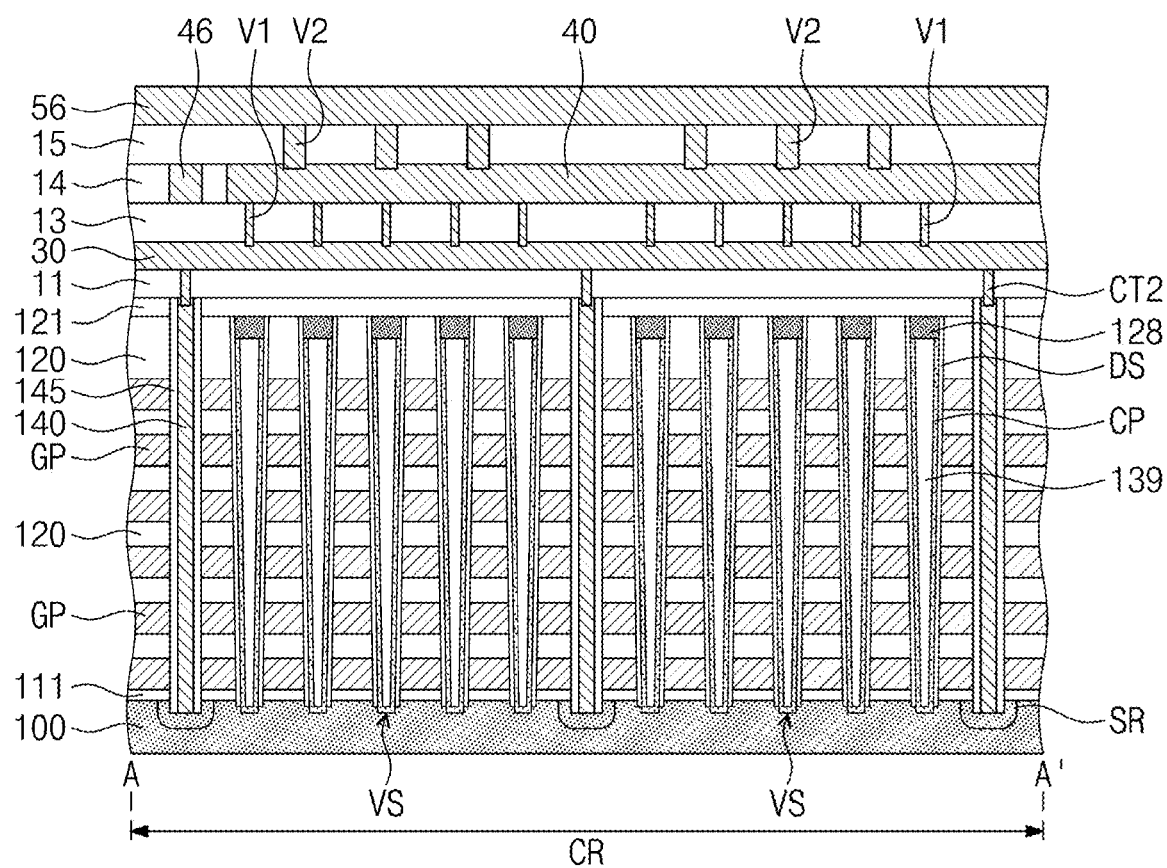
FIGS. 5A, 5B, and 5C are sectional views taken along lines A-A', B-B', and C-C', respectively, of FIG. 1.
Figure 5B:
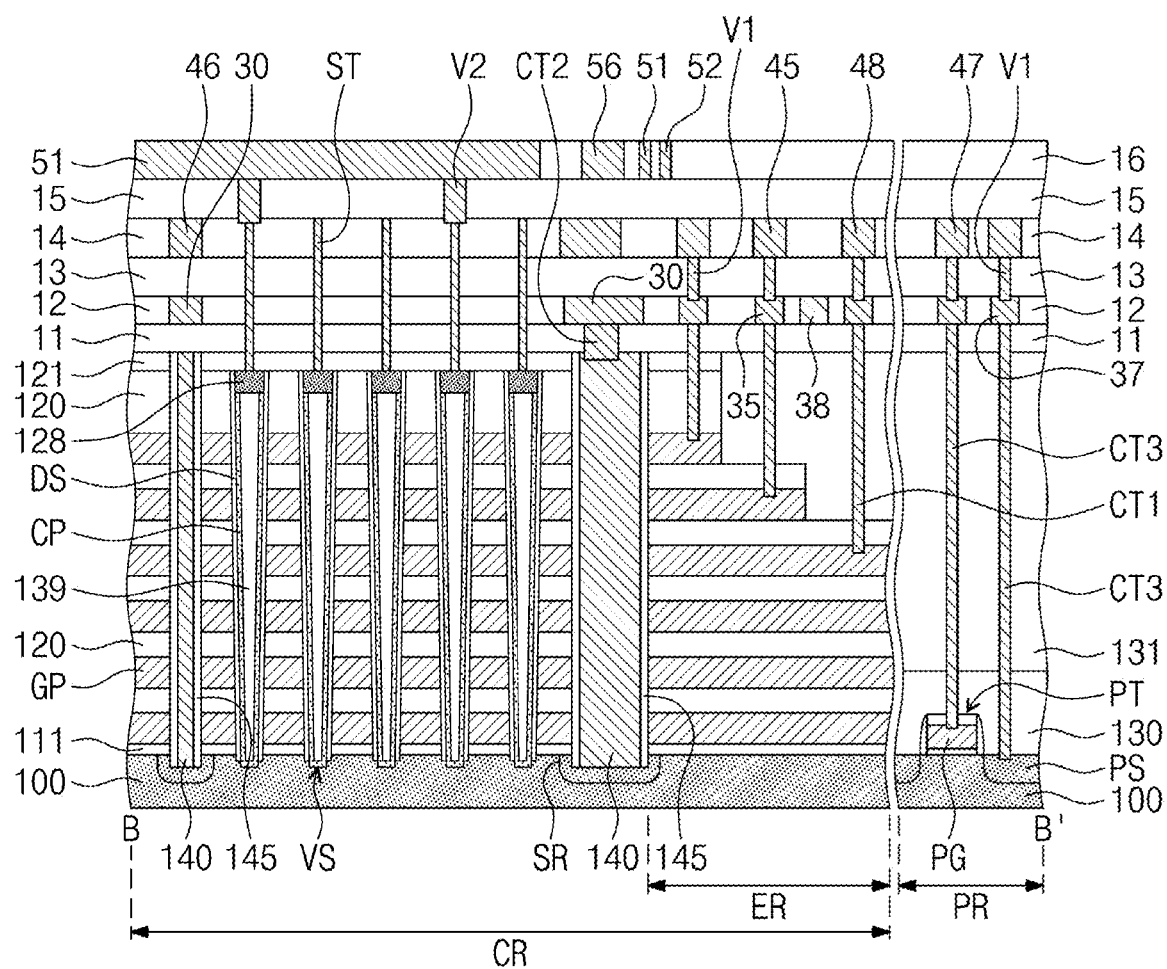
Figure 5C:
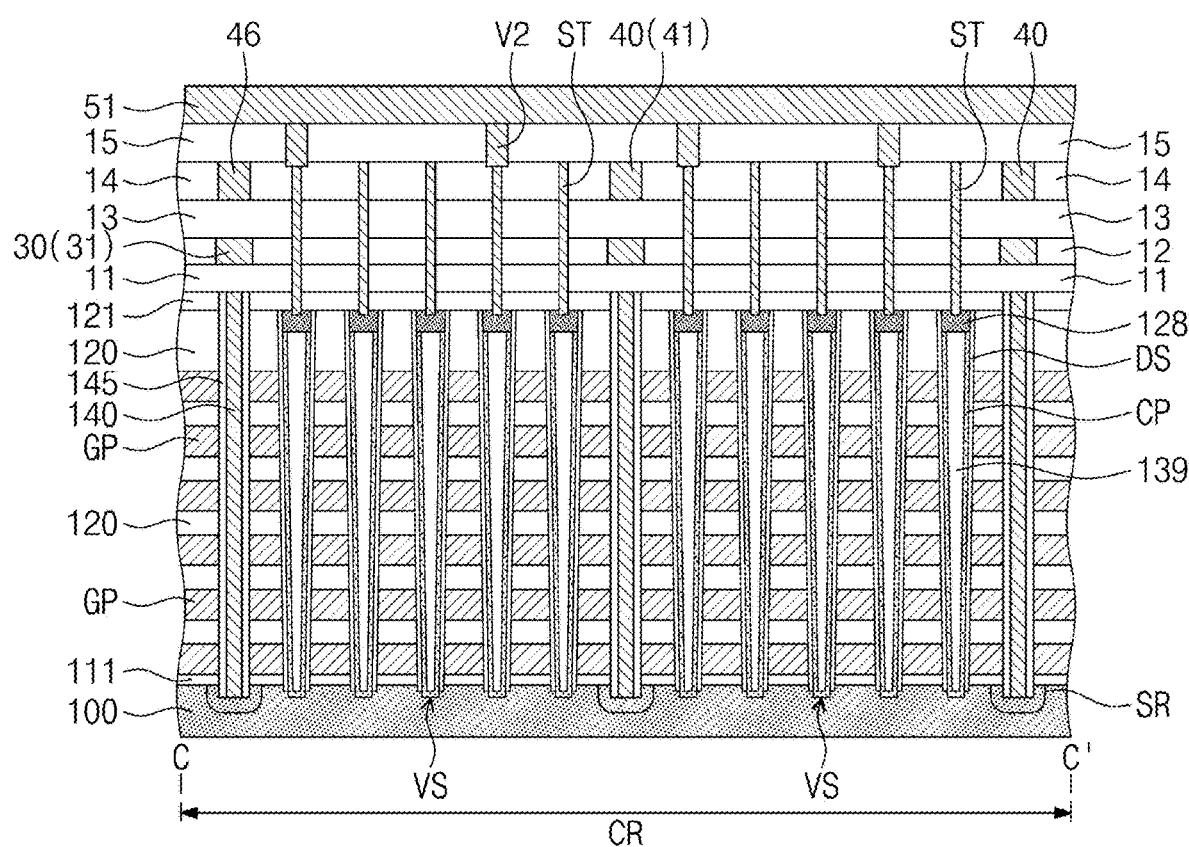

FIG. 1 is a plan view illustrating a semiconductor memory device according to an embodiment of inventive concepts. FIG. 2 is a plan view illustrating a first interconnection structure and a second interconnection structure. FIG. 3 is a plan view of the first interconnection structure. FIG. 4 is a plan view of the second interconnection structure. FIGS. 5A, 5B, and 5C are sectional views taken along lines A-A', B-B', and C-C', respectively, of FIG. 1.

Referring to FIGS. 1 to 4, 5A, 5B, and 5C, a semiconductor memory device including a cell array region CR and a peripheral circuit region PR may be provided. As an example, the semiconductor memory device may be a FLASH memory device. The cell array region CR may be a region, in which a plurality of memory cells are provided. The peripheral circuit region PR may be a region, in which a word line driver, a sense amplifier, row and column decoders, and control circuits are provided. For convenience in illustration, the peripheral circuit region PR is illustrated to be located in one of side regions of the cell array region CR, but in certain embodiments, the peripheral circuit region PR may further include a portion that is located in at least one of other side regions of the cell array region CR. As an example, the peripheral circuit region PR may be provided to enclose the cell array region CR.

The cell array region CR may include electrode structures SS, in which horizontal electrodes GP sequentially stacked on a semiconductor substrate 100 are provided. Insulating layers 120 may be provided between the horizontal electrodes GP. In other words, the horizontal electrodes GP and insulating layers 120 may be alternately and repeatedly stacked on the semiconductor substrate 100. A buffer layer 111 may be provided between the lowermost horizontal electrode GP and the semiconductor substrate 100. As an example, the insulating layers 120 and the buffer layer 111 may include a silicon oxide layer and/or a silicon oxynitride layer. The buffer layer 111 may be thinner than the insulating layers 120.

In an embodiment, the lowermost horizontal electrode may be a gate electrode of a ground selection transistor (e.g., a portion of a ground selection line). The uppermost horizontal electrode and the second uppermost horizontal electrode may serve as gate electrodes of string selection transistors (e.g., a portion of a string selection line). Horizontal electrodes between the lowermost horizontal electrode and the second uppermost horizontal electrode may serve as cell gate electrodes (e.g., some of word lines). Although six horizontal electrodes are illustrated, the number of the horizontal electrodes may be greater or smaller than six.

Each of the horizontal electrodes GP in the electrode structures SS may extend in a first direction D1. The electrode structures SS may be spaced apart from each other in a second direction D2, with separation patterns 145 interposed therebetween. Each of the separation patterns 145 may extend in the first direction D1. As an example, the separation patterns 145 may be formed of or include at least one of a silicon oxide layer, a silicon nitride layer, or a silicon oxynitride layer.

Vertical electrodes 140, which are connected to the semiconductor substrate 100, may be provided to penetrate the separation patterns 145. The vertical electrodes 140 may serve as common source lines. In an embodiment, each of the vertical electrodes 140 may have a plate-shaped pattern extending in the first direction D1. In certain embodiments, the vertical electrodes 140 may include a plurality of contacts penetrating one separation pattern 145.

The vertical electrodes 140 may be formed of or include at least one of polysilicon, metal, or conductive metal nitrides. In the case where the vertical electrodes 140 include doped polysilicon, the vertical electrodes 140 may have a second conductivity type that is different from the conductivity type of the semiconductor substrate 100. The second conductivity type may be, for example, an n-type. In the case where the vertical electrodes 140 include a metallic material, such as tungsten, titanium, tantalum, and nitrides thereof, a metal silicide layer (e.g., a tungsten silicide layer) may be further provided between the vertical electrodes 140 and the semiconductor substrate 100.

Cell impurity regions SR, which are connected to the vertical electrodes 140, may be provided in an upper portion of the semiconductor substrate 100. Each of the cell impurity regions SR may be extended along the vertical electrodes 140 or in the first direction D1. The cell impurity regions SR may serve as common source regions. The cell impurity regions SR may have a second conductivity type that is different from the conductivity type of the semiconductor substrate 100.

Vertical structures VS may be provided to penetrate the electrode structures SS and to be connected to the semiconductor substrate 100. Each of the vertical structures VS may have a circular pillar shape having a decreasing width in a downward direction. The vertical structures VS may be two-dimensionally arranged on the semiconductor substrate 100. In the present specification, the expression "elements are two-dimensionally arranged" will be used to represent that, when viewed in a plan view, the elements are disposed to form a plurality of columns and a plurality of rows, which extend in two orthogonal directions (e.g., in the first and second directions D1 and D2, respectively). For example, each column of the vertical structures VS may include a plurality of the vertical structures VS arranged in the first direction D1, and a plurality of columns of the vertical structures VS may be arranged in each of the electrode structures SS. In an embodiment, nine columns of the vertical structures VS may be provided in one electrode structure SS, as shown in FIG. 1, but inventive concepts are not limited to this example. For example, the number of the columns provided in each of the electrode structures SS may be larger than, equal to, or smaller than nine. In an embodiment, the vertical structures VS constituting odd-numbered columns may be disposed to be offset from the vertical structures VS constituting even-numbered columns, in the first direction D1.

As shown in FIGS. 5A to 5C, each of the vertical structures VS may include an insulating filling layer 139, a channel pattern CP, and a data storage layer DS. In an embodiment, the insulating filling layer 139 may be shaped like a circular pillar, and the channel pattern CP and the data storage layer DS may be sequentially provided on the insulating filling layer 139. Alternatively, the insulating filling layer 139 may not be provided. The insulating filling layer 139 may include, for example, a silicon oxide layer.

The channel pattern CP may be formed of or include a polycrystalline semiconductor material. The channel pattern CP may be in an undoped (e.g., intrinsic state) or may be lightly doped to have the first or second conductivity type. As an example, the channel pattern CP may be formed of or include polysilicon. Alternatively, the channel pattern CP may be formed of or include germanium or silicon-germanium. In certain embodiments, the channel pattern CP may include a conductive layer (e.g., metals, conductive metal nitrides, silicides) or a nano structure (e.g., carbon nanotube or graphene). The channel pattern CP may be shaped like a bottom-closed pipe. In certain embodiments, semiconductor patterns may be provided between the channel pattern CP and the semiconductor substrate 100. As an example, the semiconductor patterns may be single-crystalline silicon patterns, which are formed by an epitaxial process.

The data storage layer DS may include a blocking insulating layer adjacent to the horizontal electrodes GP, a tunnel insulating layer adjacent to the channel pattern CP, and a charge storing layer therebetween. The blocking insulating layer may be formed of or include at least one of high-k dielectric materials (e.g., aluminum oxide or hafnium oxide). The blocking insulating layer may be a multi-layered structure including a plurality of thin layers. As an example, the blocking insulating layer may include a first blocking insulating layer and a second blocking insulating layer, and each of the first and second blocking insulating layers may be formed of or include aluminum oxide and/or hafnium oxide. All of the first and second blocking insulating layers may extend along the channel pattern CP or in a vertical direction, but in certain embodiments, a portion of the first blocking insulating layer may be extended into regions between the horizontal electrodes GP and the insulating layers 120.

The charge storing layer may be a charge trap layer or an insulating layer including conductive nano-particles. The charge trap layer may include, for example, a silicon nitride layer. The tunnel insulating layer may be formed of or include at least one of silicon oxide and/or high-k dielectric materials (e.g., hafnium oxide or aluminum oxide). The charge storing layer and the tunnel insulating layer may be extended along the channel pattern CP or in a vertical direction. The data storage layer DS may be a pipe-shaped pattern with open top and bottom.

Pad patterns 128 may be provided in upper portions of the vertical structures VS. The pad patterns 128 may be formed of or include at least one of doped polysilicon or metallic materials. Side surfaces of the pad patterns 128 may be in contact with an inner side surface of the data storage layer DS and a top surface of the channel pattern CP. The insulating layers 120 may include an uppermost insulating layer 121 covering the pad patterns 128. Hereinafter, the uppermost insulating layer 121 will be described as a part of the insulating layers 120.

The cell array region CR may include an extension region ER, which is provided adjacent to the peripheral circuit region PR. In the extension region ER, the horizontal electrodes GP may have exposed end portions (e.g., pads) forming a staircase structure. In the extension region ER, a side surface of an end portion of each of the insulating layers 120 may be aligned to a side surface of the end portion of a corresponding one of the horizontal electrodes GP disposed thereunder.

In the extension region ER, dummy vertical structures DVS may be provided to penetrate the electrode structures SS. In an embodiment, the dummy vertical structures DVS may be connected to the semiconductor substrate 100. Widths of the dummy vertical structures DVS may be greater than widths of the vertical structures VS. Alternatively, the dummy vertical structures DVS may have substantially the same size as the vertical structures VS. The dummy vertical structures DVS may have substantially the same stacking structure as the vertical structures VS and may include the same material as the vertical structures VS.

An insulating separation pattern 19 may be provided to penetrate some of the horizontal electrodes GP and to extend in the first direction D1. In an embodiment, the insulating separation pattern 19 may be provided between the vertical electrodes 140 to separate at least one of the horizontal electrodes GP, which serve as the gate electrodes of the string selection transistor, in the second direction D2. For example, the insulating separation pattern 19 may be provided to penetrate the uppermost and second uppermost ones of the horizontal electrodes GP. The insulating separation pattern 19 may be formed of or include at least one of a silicon oxide layer or a silicon nitride layer.

In the extension region ER, dummy separation patterns 142 may be provided between the vertical electrodes 140. The dummy separation patterns 142 may penetrate the electrode structures SS, in the extension region ER. The dummy separation patterns 142 may be concurrently formed with the vertical electrodes 140 and may include the same layers as the vertical electrodes 140. The dummy separation patterns 142 may be extended in the first direction D1 and may be connected to the insulating separation pattern 19. The dummy separation patterns 142 may be formed of or include at least one of silicon oxide or silicon oxynitride.

An upper interlayered insulating layer 131 may be provided to cover the extension region ER and the peripheral circuit region PR. The upper interlayered insulating layer 131 may be formed of or include a silicon oxide layer.

A peripheral transistor PT may be disposed on the semiconductor substrate 100 and in the peripheral circuit region PR. The upper interlayered insulating layer 131 may cover the peripheral transistor PT. The peripheral transistor PT may include a peripheral gate electrode PG and a peripheral impurity region PS adjacent thereto. The peripheral transistor PT may be a PMOS transistor and/or an NMOS transistor, and the conductivity type of the peripheral impurity region PS may be determined depending on the type of the transistor. In an embodiment, the peripheral impurity region PS may be an n-type impurity region. In the peripheral circuit region PR, a lower interlayered insulating layer 130 may be provided to cover the peripheral transistor PT. The lower interlayered insulating layer 130 may be provided between the peripheral gate electrode PG and the upper interlayered insulating layer 131.

A first upper insulating layer 11 may be provided to cover the electrode structures SS and the upper interlayered insulating layer 131. First to third contacts CT1, CT2, and CT3 may be provided to penetrate the first upper insulating layer 11. As will be explained in the description of the fabricating method, the first to third contacts CT1, CT2, and CT3 may be structures, which are formed concurrently by the same deposition process. The first to third contacts CT1, CT2, and CT3 may have top surfaces that are positioned at the same level. For example, the top surfaces of the first to third contacts CT1, CT2, and CT3 may be positioned at the same level as a top surface of the first upper insulating layer 11. The first to third contacts CT1, CT2, and CT3 may be formed of or include at least one of tungsten, titanium, and/or nitrides thereof. For example, the first to third contacts CT1, CT2, and CT3 may be provided to have a double-layered structure including a titanium nitride layer and a tungsten layer.

The first contacts CT1 may be connected to the end portions of the horizontal electrodes GP, in the extension region ER. The second contacts CT2 may be connected to upper portions of the vertical electrodes 140. The third contacts CT3 may be connected to the peripheral transistor PT, in the peripheral circuit region PR. As an example, the third contacts CT3 may be connected to the peripheral gate electrode PG or the peripheral impurity region PS.

As shown in FIGS. 1 to 3, the second contacts CT2 may have a different shape from the first and third contacts CT1 and CT3. As an example, the first and third contacts CT1 and CT3 may be a circular or square shape whose widths in the first and second directions D1 and D2 are substantially the same, and a first width W1 of the second contacts CT2 in the first direction D1 may be greater than a second width W2 in the second direction D2. For example, the second contacts CT2 may have a bar or elliptical shape whose long axis is parallel to the first direction D1.

A second separation distance d2 between the second contacts CT2 in the first direction D1 may be greater than a first separation distance d1 between the first contacts CT1 in the first direction D1. As an example, the second separation distance d2 may be about 10 to 20 times the first separation distance d1. In an embodiment, the second separation distance d2 may range from about 60 μm to about 120 μm. The first separation distance d1 may range from about 0.3 μm to about 0.11 μm.

A second upper insulating layer 12 may be provided on the first upper insulating layer 11. A first interconnection structure 30 may be provided in the second upper insulating layer 12. As shown in FIGS. 1 and 3, the first interconnection structure 30 may have a grid shape, when viewed in a plan view. For example, the first interconnection structure 30 may include first sub-interconnection lines 31 extending in the first direction D1 and second sub-interconnection lines 32 extending in the second direction D2. The first sub-interconnection lines 31 may be overlapped with the vertical electrodes 140, respectively. The first sub-interconnection lines 31 may be connected to the second contacts CT2 and may be electrically connected to the vertical electrodes 140 through the second contacts CT2. The second sub-interconnection lines 32 may be overlapped with two or more columns of the vertical structures VS. The vertical structures VS, which are overlapped with the second sub-interconnection lines 32, may not be connected to third interconnection lines through studs to be described below.

In the extension region ER, first extension pads 35 and first intermediate interconnection lines 38 may be provided in the second upper insulating layer 12. The first extension pads 35 and the first intermediate interconnection lines 38 may be connected to the top surfaces of the first contacts CT1. The first intermediate interconnection lines 38 may be used to apply voltages to the horizontal electrodes GP through the first contacts CT1. In the peripheral circuit region PR, first peripheral pads 37 may be provided in the second upper insulating layer 12. The first peripheral pads 37 may be connected to the top surfaces of the third contacts CT3.

In an embodiment, each of the first interconnection structure 30, the first extension pads 35, the first intermediate interconnection lines 38, and the first peripheral pads 37 may include a titanium nitride layer and a tungsten layer. The titanium nitride layer may be provided to cover side and bottom surfaces of the tungsten layer.

A third upper insulating layer 13 and a fourth upper insulating layer 14 may be sequentially provided on the second upper insulating layer 12. First vias V1 may be provided in the third upper insulating layer 13. A second interconnection structure 40 may be provided in the fourth upper insulating layer 14. The second interconnection structure 40 may have a grid shape, as shown in FIGS. 1, 2, and 4. In an embodiment, the second interconnection structure 40 may include third sub-interconnection lines 41 extending in the first direction D1 and fourth sub-interconnection lines 42 extending in the second direction D2. The third sub-interconnection lines 41 may be overlapped with the first sub-interconnection lines 31, respectively. The fourth sub-interconnection lines 42 may be overlapped with the second sub-interconnection lines 32, respectively. The fourth sub-interconnection lines 42 may be electrically connected to the second sub-interconnection lines 32 through the first vias V1. In an embodiment, the first vias V1 may not be provided between the third sub-interconnection lines 41 and the first sub-interconnection lines 31, but in certain embodiments, the first vias V1 may also be provided between the third sub-interconnection lines 41 and the first sub-interconnection lines 31.

Second intermediate interconnection lines 46, second extension pads 45, second peripheral pads 47, and a third intermediate interconnection line 48 may be provided in the fourth upper insulating layer 14. The second intermediate interconnection lines 46 may be disposed at both sides of the second interconnection structure 40 in a plan view and may be overlapped with some of the vertical electrodes 140 in a sectional view. End portions of the second intermediate interconnection lines 46 may be extended to cell blocks adjacent thereto. The second extension pads 45 may be disposed on the first extension pads 35 and in the extension region ER and may be electrically connected to the first extension pads 35 through the first vias V1. The second peripheral pads 47 may be electrically connected to the first peripheral pads 37 through the first vias V1. The third intermediate interconnection line 48 may be electrically connected to the first peripheral pads 37 through the first vias V1 in the extension region ER. The third intermediate interconnection line 48 may be used to apply voltages to the horizontal electrodes GP through the first contacts CT1.

In an embodiment, each of the second interconnection structure 40, the second extension pads 45, the second intermediate interconnection lines 46, the third intermediate interconnection line 48, and the second peripheral pads 47 may include a titanium layer, a titanium nitride layer, or a tungsten layer. As an example, the titanium nitride layer may cover side and bottom surfaces of the tungsten layer, and the titanium layer may cover side and bottom surfaces of the titanium nitride layer. The first vias V1, along with an element disposed thereon (e.g., the second interconnection structure 40, the second extension pads 45, the second intermediate interconnection lines 46, the third intermediate interconnection line 48, or the second peripheral pads 47), may be formed by a dual damascene process.

Studs ST may be provided to penetrate the first to fourth upper insulating layers 11, 12, 13, and 14 and to be connected to the pad patterns 128 of the vertical structures VS. The studs ST may be connected to the vertical structures VS, respectively, but may not be disposed on some of the vertical structures VS, which are overlapped with the first interconnection structure 30, as described above. The studs ST may include the same material as the second interconnection structure 40.

A fifth upper insulating layer 15 and a sixth upper insulating layer 16 may be sequentially provided on the fourth upper insulating layer 14. Second vias V2 may be provided in the fifth upper insulating layer 15. Third interconnection lines 51 and 52 and fourth interconnection lines 56 may be provided in the sixth upper insulating layer 16. The third interconnection lines 51 and 52 may be electrically connected to the studs ST through the second vias V2. The fourth interconnection lines 56 may be connected to the second interconnection structure 40 through the second vias V2. A width of each of the fourth interconnection lines 56 in the first direction D1 may be larger than a width of each of the third interconnection lines 51 and 52 in the first direction D1. As an example, the width of each of the fourth interconnection lines 56 may be about 3 to about 8 times the width of each of the third interconnection lines 51 and 52. A pair of the third interconnection lines 51 and 52 may be disposed on one row of the vertical structures VS arranged in the second direction D2. In an embodiment, odd-numbered ones of the vertical structures VS constituting one row may be connected to a (3a)-th interconnection line 51, and even-numbered ones of the vertical structures VS constituting one row may be connected to a (3b)-th interconnection line 52. A size of each of the second vias V2 connected to the fourth interconnection lines 56 may be larger than a size of each of the second vias V2 connected to the third interconnection lines 51 and 52, but inventive concepts are not limited to this example.

Upper interconnection lines 58 may be provided in the sixth upper insulating layer 16. The upper interconnection lines 58 may be connected to the second intermediate interconnection lines 46 through the second vias V2. As an example, the third interconnection lines 51 and 52, the fourth interconnection lines 56, and the upper interconnection lines 58 may be formed of or include a copper layer.

Due to the first interconnection structure 30 and the second interconnection structure 40 according to an embodiment of inventive concepts, it may be possible to electrically connect the vertical electrodes 140 with each other. In addition, the first to third contacts CT1, CT2, and CT3 may be formed to have top surfaces that are positioned at the same level, and this may make it possible to more efficiently arrange higher interconnection lines, which are disposed on the first to third contacts CT1, CT2, and CT3.

Figure 6:
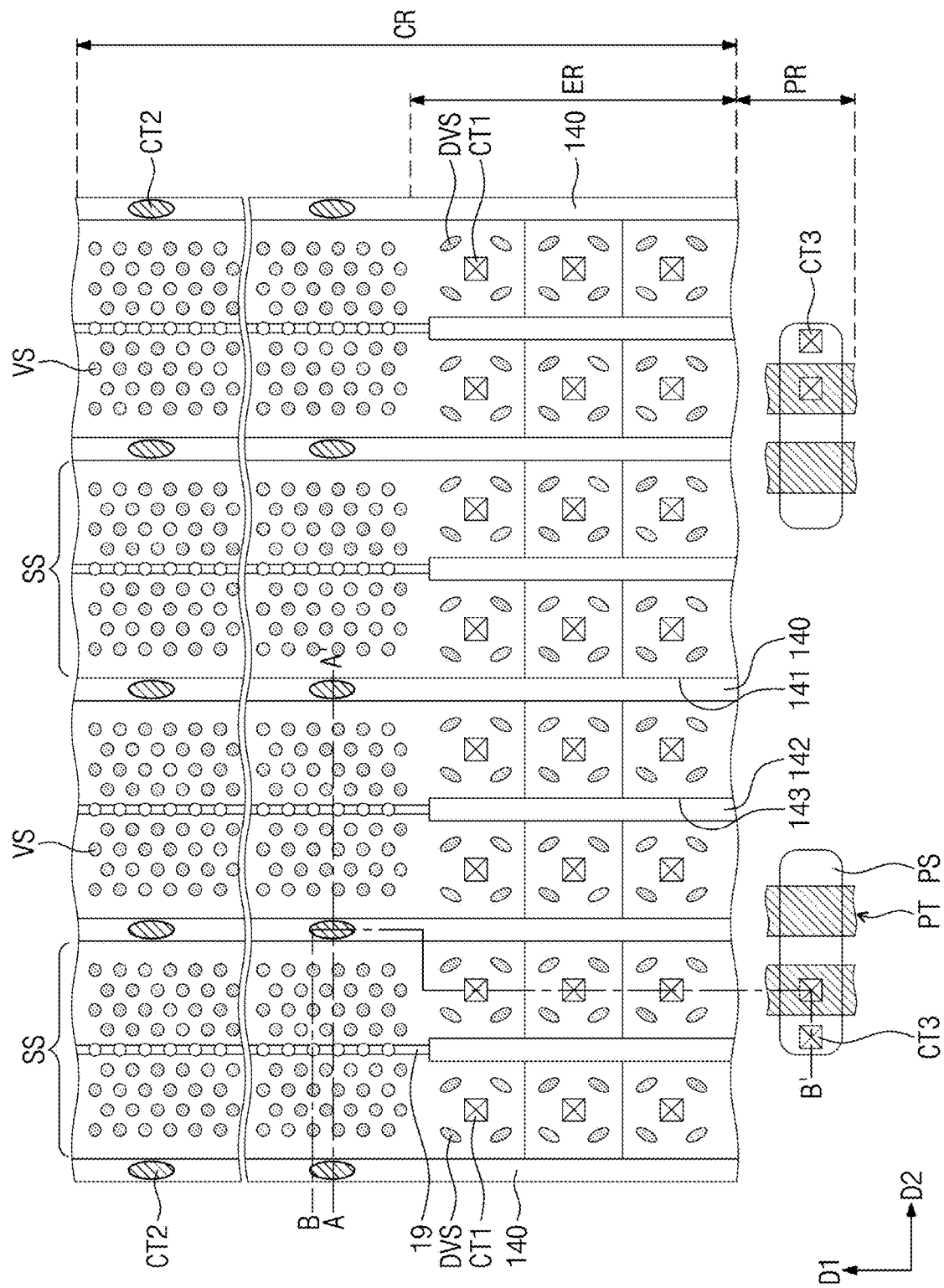
FIGS. 6, 13, and 15 are plan views illustrating a method of fabricating a semiconductor memory device, according to an embodiment of inventive concepts.
Figure 7A:
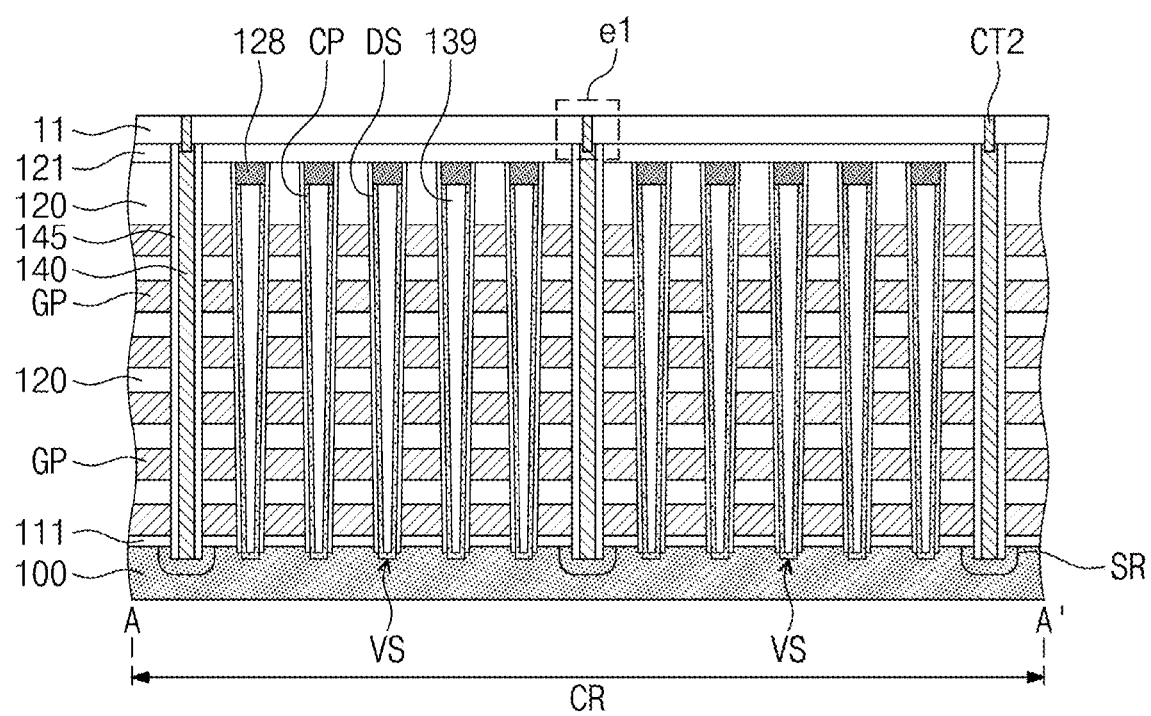
FIGS. 7A and 7B are sectional views taken along lines A-A' and B-B', respectively, of FIG. 6.
Figure 7B:
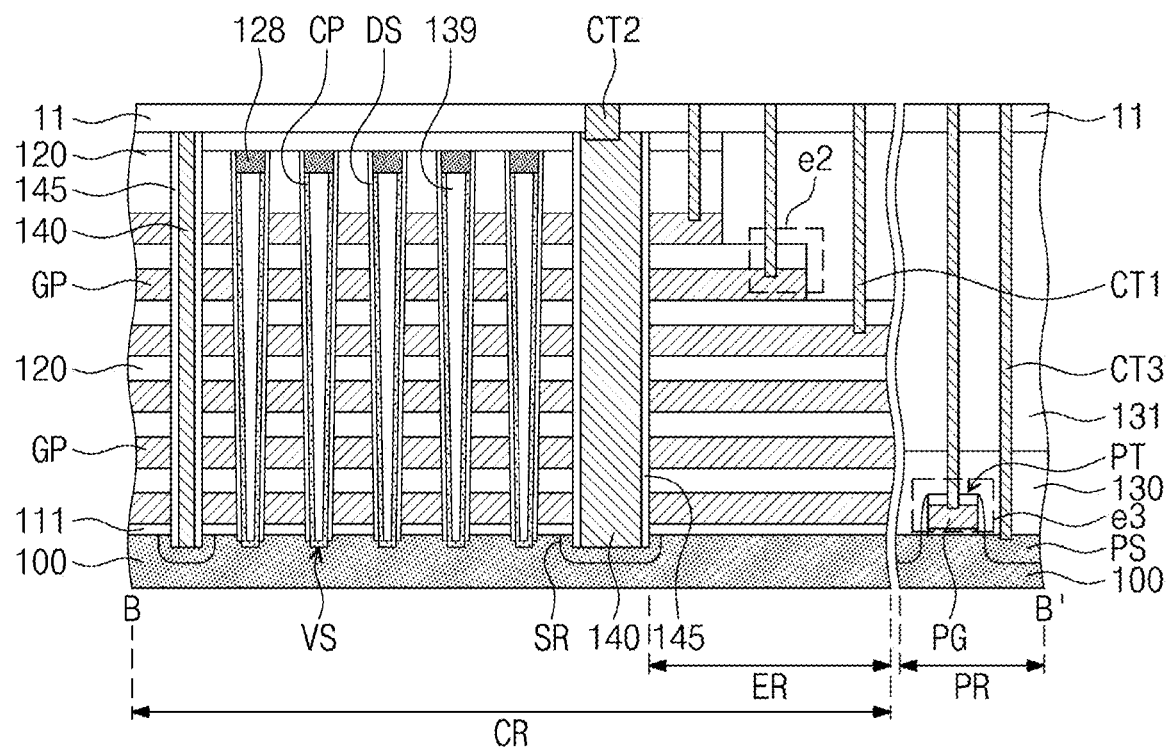
Figure 13:
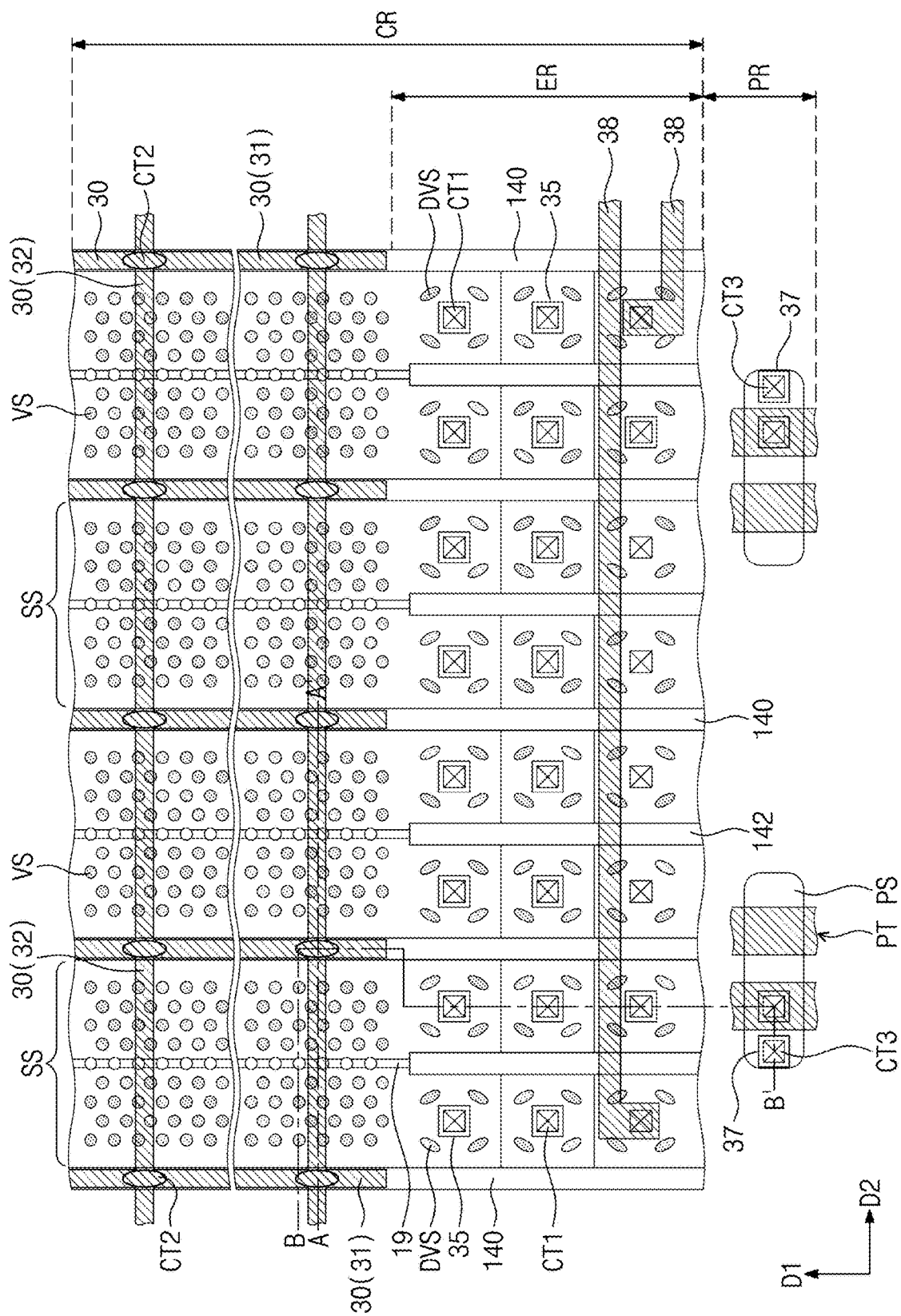
Figure 14A:
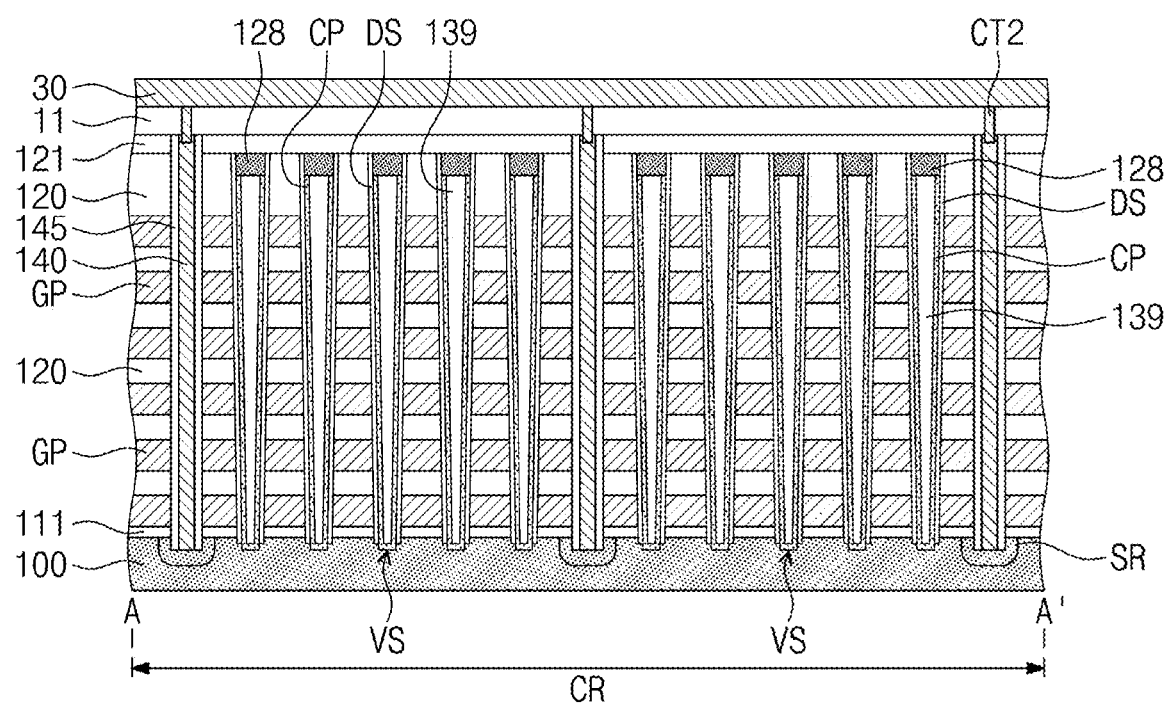
FIGS. 14A and 14B are sectional views taken along lines A-A' and B-B', respectively, of FIG. 13.
Figure 14B:
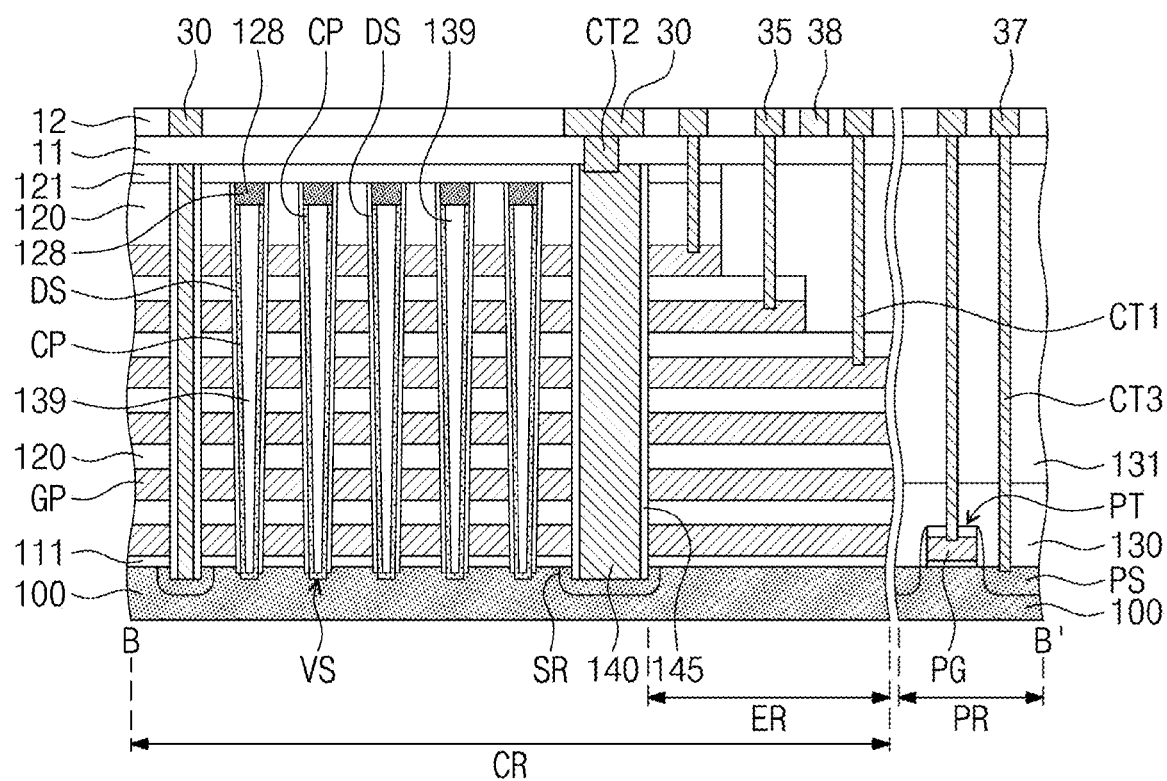
Figure 15:
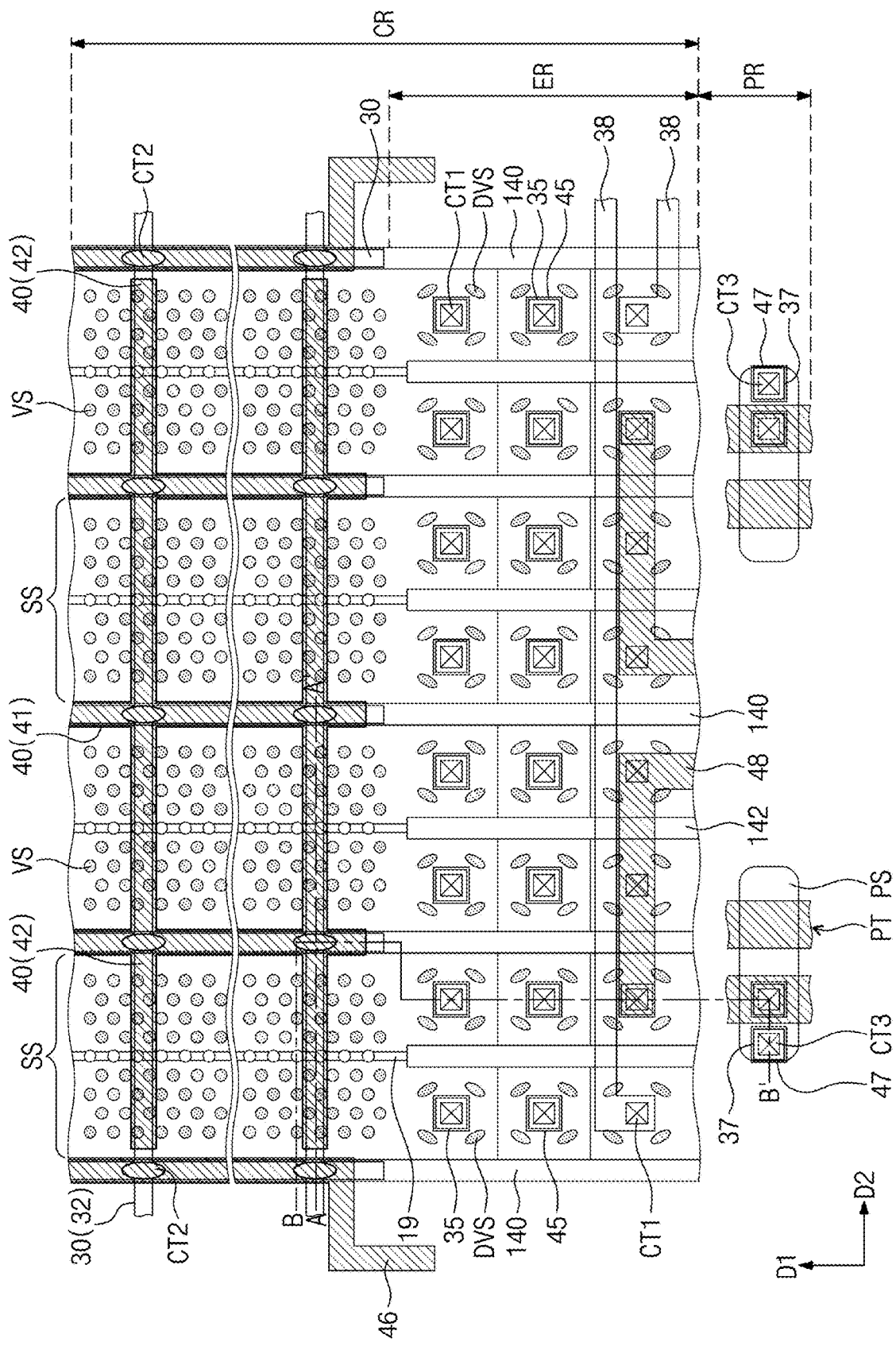
Figure 16A:
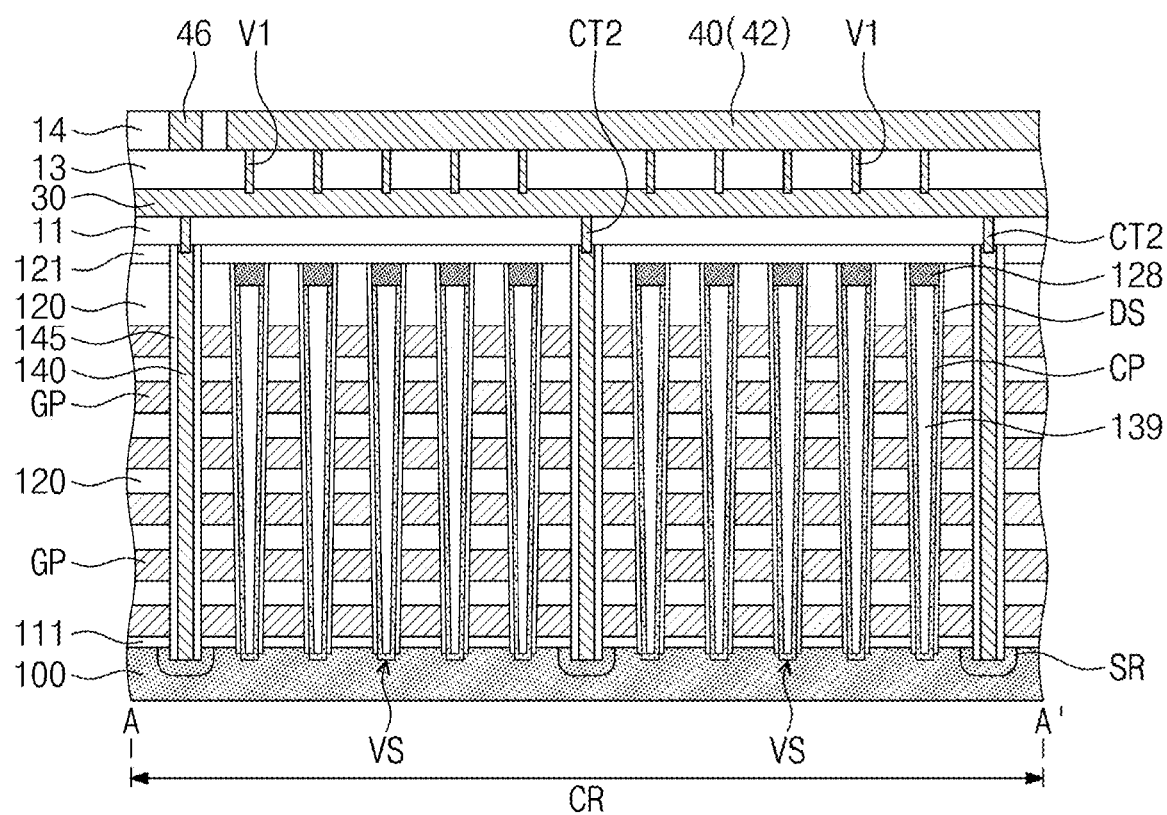
FIGS. 16A and 16B are sectional views taken along lines A-A' and B-B', respectively, of FIG. 15.
Figure 16B:
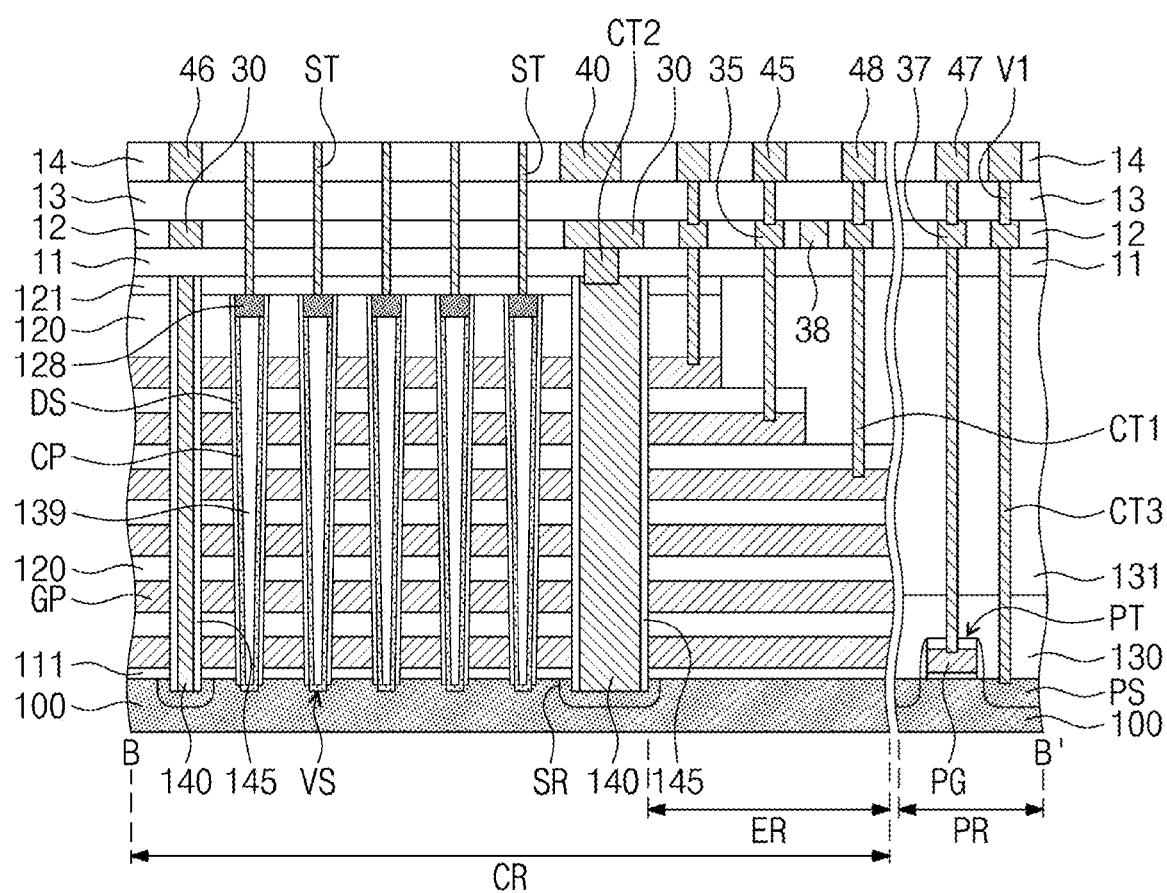

FIGS. 6, 13, and 15 are plan views illustrating a method of fabricating a semiconductor memory device, according to an embodiment of inventive concepts. FIGS. 7A and 7B are sectional views taken along lines A-A' and B-B', respectively, of FIG. 6. FIGS. 14A and 14B are sectional views taken along lines A-A' and B-B', respectively, of FIG. 13. FIGS. 16A and 16B are sectional views taken along lines A-A' and B-B', respectively, of FIG. 15.

Referring to FIGS. 6, 7A, and 7B, the semiconductor substrate 100 including the cell array region CR and the peripheral circuit region PR may be provided. The cell array region CR may include the extension region ER, which is provided adjacent to the peripheral circuit region PR. As an example, the semiconductor substrate 100 may be a single-crystalline silicon substrate. In an embodiment, the semiconductor substrate 100 may be doped to have a first conductivity type. Here, the first conductivity type may be a p-type. The peripheral transistors PT may be formed on the peripheral circuit region PR. The formation of the peripheral transistors PT may include forming the peripheral impurity region PS and the peripheral gate electrode PG. The conductivity type of the peripheral impurity region PS may be determined depending on the type of the peripheral transistors PT. After the formation of the peripheral transistors PT, the lower interlayered insulating layer 130 may be formed to cover the peripheral transistors PT. In an embodiment, the lower interlayered insulating layer 130 may be formed of or include a silicon oxide layer.

The buffer layer 111 may be formed on the cell array region CR, and then, sacrificial layers and insulating layers 120 may be alternatively and repeatedly formed on the buffer layer 111. The buffer layer 111 may be a silicon oxide layer. In an embodiment, the buffer layer 111 may be formed by a thermal oxidation process. The sacrificial layers and the insulating layers 120 may be formed of different materials that have an etch selectivity with respect to each other. For example, a material for the insulating layers 120 may be selected to limit and/or prevent the insulating layers 120 from being excessively etched in a process for etching the sacrificial layers using a specific etch recipe.

The vertical structures VS, which are connected to the semiconductor substrate 100, may be formed to penetrate the sacrificial layers and the insulating layers 120. The dummy vertical structures DVS, along with the vertical structures VS, may be formed in the extension region ER. The formation of the vertical structures VS may include forming vertical holes, which penetrate the sacrificial layers and the insulating layers 120 and expose the semiconductor substrate 100, by an anisotropic etching process, and sequentially depositing the data storage layer DS, the channel pattern CP, and the insulating filling layer 139 to fill the vertical holes. Each of the data storage layer DS, the channel pattern CP, and the insulating filling layer 139 may be formed by at least one of a chemical vapor deposition process, an atomic layer deposition process, and a sputtering process. The channel pattern CP may be formed to penetrate the data storage layer DS. The insulating filling layer 139 may be formed to completely fill the vertical holes, in which the data storage layer DS and the channel pattern CP are formed. Thereafter, upper portions of the insulating filling layer 139 and the channel pattern CP may be removed to form vertically-recessed regions, and then, the pad patterns 128 may be formed to fill the vertically-recessed regions, respectively. The pad patterns 128 may be formed of or include at least one of doped polysilicon or metal.

The uppermost insulating layer 121 may be formed to cover the pad patterns 128. Hereinafter, the uppermost insulating layer 121 will be described as a part of the insulating layers 120. The sacrificial layers and the insulating layers 120 may be patterned to form a staircase structure on the extension region ER. Next, the upper interlayered insulating layer 131 may be formed to cover the cell array region CR and the peripheral circuit region PR. The upper interlayered insulating layer 131 may be formed of or include silicon oxide.

Separation trenches 141 and 143 may be formed to penetrate the sacrificial layers and the insulating layers 120. The separation trenches 141 and 143 may include first separation trenches 141, which are extended in the first direction D1 to pass through the cell array region CR, and second separation trenches 143, which are locally provided within the extension region ER. The separation trenches 141 and 143 may be formed to expose a top surface of the semiconductor substrate 100. The separation trenches 141 and 143 may be formed by an anisotropic etching process.

The sacrificial layers may be replaced with the horizontal electrodes GP. For example, the sacrificial layers exposed through the separation trenches 141 and 143 may be removed, and then, the horizontal electrodes GP may be formed in empty regions, which are formed by removing the sacrificial layers. In an embodiment, the removal of the sacrificial layers may be performed using an etching solution containing phosphoric acid. In an embodiment, the blocking insulating layer may be formed to conformally cover the empty regions, which are formed by removing the sacrificial layers, before the formation of the horizontal electrodes GP.

The dummy separation patterns 142 may be formed to fill the second separation trenches 143. The dummy separation patterns 142 may be formed of or include a silicon oxide layer. The cell impurity regions SR may be formed in upper portions of the semiconductor substrate 100, which are exposed through the first separation trenches 141. The cell impurity regions SR may be extended in the first direction D1 and may be spaced apart from each other in the second direction D2. The cell impurity regions SR may have a second conductivity type that is different from the conductivity type of the semiconductor substrate 100. The second conductivity type may be, for example, an n-type.

The separation patterns 145 and the vertical electrodes 140 may be formed in the first separation trenches 141, and here, the vertical electrodes 140 may penetrate the separation patterns 145 and may be connected to the semiconductor substrate 100. The vertical electrodes 140 may be plate-shaped patterns extending in the first direction D1. In an embodiment, the separation patterns 145 may be formed in the shape of a spacer covering side surfaces of the separation trenches 141, and the vertical electrodes 140 may be formed to fill the separation trenches 141, in which the separation patterns 145 are formed. In certain embodiments, the formation of the vertical electrodes 140 may include forming contact holes penetrating the separation patterns 145 and filling the contact holes with a conductive material. The separation patterns 145 may be formed to include at least one of a silicon oxide layer, a silicon nitride layer, or a silicon oxynitride layer. The vertical electrodes 140 may be formed to include at least one of doped polysilicon, metal, or conductive metal nitrides.

In the case where the vertical electrodes 140 include doped polysilicon, the vertical electrodes 140 may be doped to have a second conductivity type that is different from the conductivity type of the semiconductor substrate 100, for example, in an in-situ manner. The second conductivity type may be, for example, an n-type.

The first upper insulating layer 11 may be formed to cover both of the cell array region CR and the peripheral circuit region PR. In an embodiment, the first upper insulating layer 11 may be formed of or include silicon oxide. The first to third contacts CT1, CT2, and CT3 may be formed to penetrate the first upper insulating layer 11. Hereinafter, a method of forming the first to third contacts CT1, CT2, and CT3 will be described in more detail.

Figure 8:
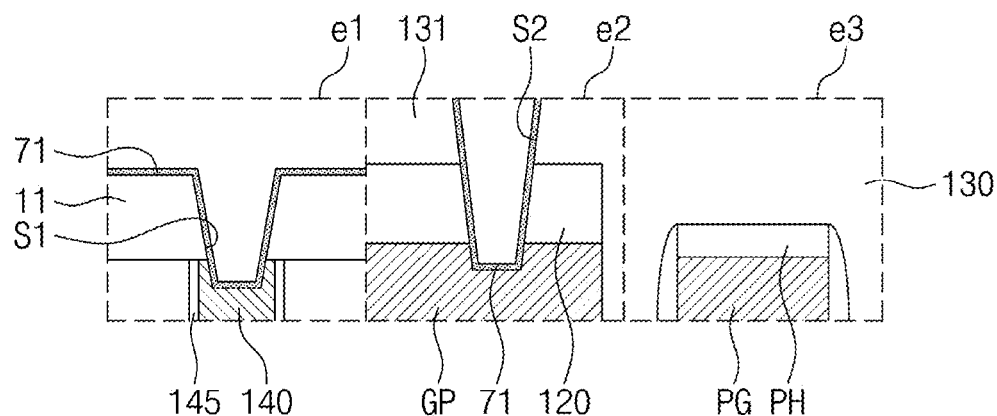
FIGS. 8, 9, and 10 are enlarged sectional views illustrating portions of e1, e2, and e3 of FIGS. 7A and 7B, according to an embodiment of inventive concepts.
Figure 9:
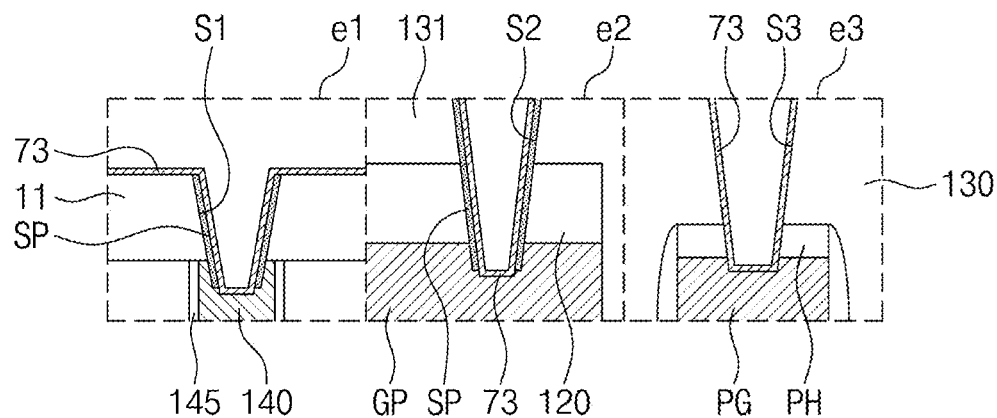
Figure 10:
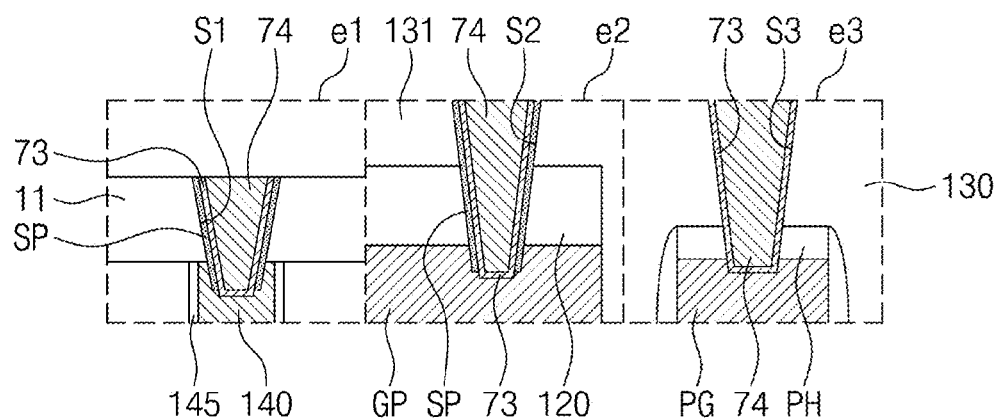

FIGS. 8, 9, and 10 are enlarged sectional views illustrating portions of e1, e2, and e3 of FIGS. 7A and 7B, according to an embodiment of inventive concepts. Referring to FIGS. 7A, 7B, and 8, first holes S1 may be formed to penetrate the first upper insulating layer 11 and to expose the vertical electrodes 140. Second holes S2 may be formed to penetrate the first upper insulating layer 11 and the upper interlayered insulating layer 131 and to expose the horizontal electrodes GP. The first holes S1 and the second holes S2 may be formed concurrently by the same etching process.

Referring to FIGS. 7A, 7B, and 9, a spacer layer 71 may be formed to cover the first holes S1 and the second holes S2. The spacer layer 71 may be formed of or include silicon nitride. Thereafter, third holes S3 may be formed to partly expose the peripheral transistors PT. In an embodiment, the third holes S3 may be formed to penetrate the first upper insulating layer 11, the upper interlayered insulating layer 131, the lower interlayered insulating layer 130, and a peripheral gate capping layer PH and to expose the peripheral gate electrode PG. An anisotropic etching process may be performed to remove a lower portion of the spacer layer 71, and thus, spacer patterns SP may be formed to expose top surfaces of the vertical and horizontal electrodes 140 and GP. The formation of the spacer patterns SP may include a cleaning process.

A barrier layer 73 may be formed to conformally cover the first to third holes S1, S2, and S3. The barrier layer 73 may be formed of or include at least one of, for example, titanium, tantalum and/or conductive nitrides thereof. In an embodiment, the barrier layer 73 may be formed by sequentially stacking a titanium layer and a titanium nitride layer.

Referring to FIGS. 7A, 7B, and 10, a metal layer 74 may be formed on the barrier layer 73 to fill the first to third holes S1, S2, and S3, and then, a planarization process may be performed to form the first to third contacts CT1, CT2, and CT3. The metal layer 74 may be formed of or include, for example, tungsten.

Figure 11:
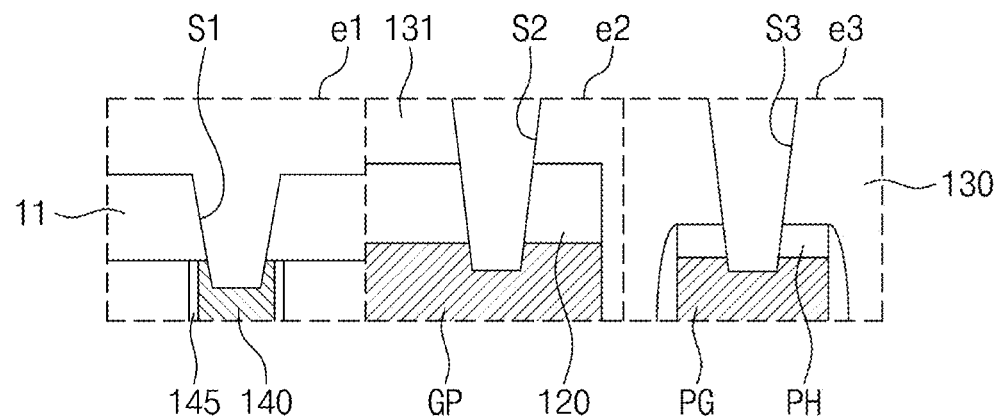
FIGS. 11 and 12 are enlarged sectional views illustrating portions of e1, e2, and e3 of FIGS. 7A and 7B, according to other embodiment of inventive concepts.
Figure 12:
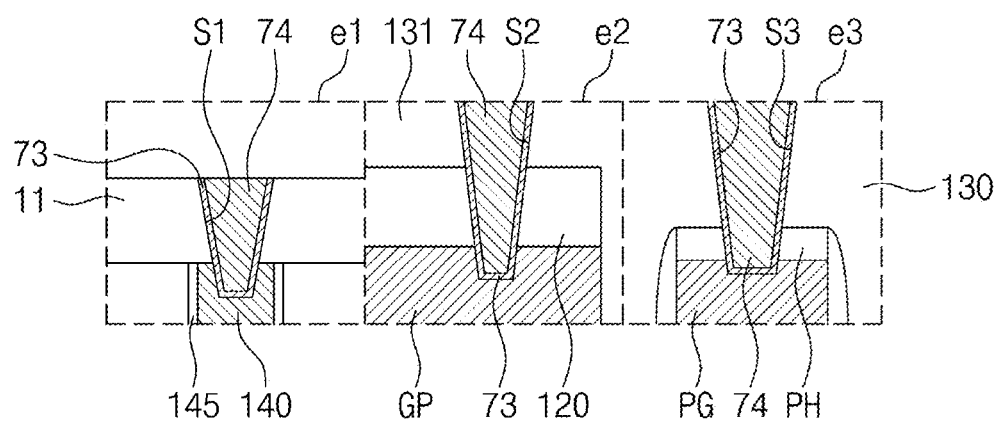

FIGS. 11 and 12 are enlarged sectional views illustrating portions of e1, e2, and e3 of FIGS. 7A and 7B, according to other embodiment of inventive concepts. For concise description, a previously described element may be identified by the same reference number without repeating an overlapping description thereof.

Referring to FIGS. 7A, 7B, and 11, the first holes S1, the second holes S2, and the third holes S3 may be formed concurrently by the same etching process. Referring to FIGS. 7A, 7B, and 12, the barrier layer 73 and the metal layer 74 may be sequentially formed to fill the first holes S1, the second holes S2, and the third holes S3. In the present embodiment, the formation of the spacer patterns SP described with reference to FIGS. 8 to 10 may be omitted.

Referring to FIGS. 13, 14A, and 14B, the second upper insulating layer 12 may be formed on the first upper insulating layer 11. The second upper insulating layer 12 may be formed of or include, for example, silicon oxide. The first interconnection structure 30 may be formed in the second upper insulating layer 12. The first extension pads 35, the first peripheral pads 37, and the first intermediate interconnection lines 38, along with the first interconnection structure 30, may be formed in the second upper insulating layer 12. The first interconnection structure 30, the first extension pads 35, the first peripheral pads 37, and the first intermediate interconnection lines 38 may be referred to as a first upper conductive layer. The formation of the first upper conductive layer may include patterning the second upper insulating layer 12 to form recess regions and filling the recess regions with a conductive material. The first the upper conductive layer may include a conductive metal nitride layer (e.g., a titanium nitride layer or a tantalum nitride layer) and a metal layer (e.g., a tungsten layer). In an embodiment, the first upper conductive layer may have a double-layered structure including a titanium nitride layer and a tungsten layer.

Referring to FIGS. 15, 16A, and 16B, the third upper insulating layer 13 and the fourth upper insulating layer 14 may be sequentially formed on the second upper insulating layer 12. The third upper insulating layer 13 and the fourth upper insulating layer 14 may be formed of or include, for example, silicon oxide. The first vias V1 may be formed in the third upper insulating layer 13, and the second interconnection structure 40, the second intermediate interconnection lines 46, the second extension pads 45, the second peripheral pads 47, and the third intermediate interconnection line 48 may be formed in the fourth upper insulating layer 14. The second interconnection structure 40, the second intermediate interconnection lines 46, the second extension pads 45, the second peripheral pads 47, and the third intermediate interconnection line 48 may be referred to as a second upper conductive layer.

The first vias V1 and the second upper conductive layer may be formed through a dual damascene process (in particular, by the same deposition process). For example, the process of forming the first vias V1 and the second upper conductive layer may include forming first and second recess regions, which penetrate the third upper insulating layer 13 and the fourth upper insulating layer 14, respectively, and then, simultaneously filling the first and second recess regions through a deposition process. In an embodiment, the deposition process may include sequentially forming a first metal layer, a conductive metal nitride layer, and a second metal layer. The first vias V1 and the second upper conductive layer may have a triple-layered structure including a titanium layer, a titanium nitride layer, and a tungsten layer. In this case, the first vias V1 and the second upper conductive layer may further include the titanium layer, compared with the first upper conductive layer of the double-layered structure. Alternatively, the first vias V1 and the second upper conductive layer may be formed by separate deposition processes.

The studs ST may be formed to penetrate the first to fourth upper insulating layers 11, 12, 13, and 14 and to be connected to the pad patterns 128. The formation of the studs ST may include forming penetration holes penetrating the first to fourth upper insulating layers 11, 12, 13, and 14 and filling the penetration holes with a conductive material. The studs ST may include a conductive metal nitride layer and/or a metal layer. As an example, the studs ST may include a titanium nitride layer and a tungsten layer. The studs ST may be formed by the same deposition process as that for the second upper conductive layer and may be formed of the same material as the second upper conductive layer.

Referring back to FIGS. 1, 5A, 5B, and 5C, the fifth upper insulating layer 15 may be formed on the fourth upper insulating layer 14. As an example, the fifth upper insulating layer 15 may be formed of or include silicon oxide. The second vias V2 may be formed in the fifth upper insulating layer 15. The second vias V2 may include a conductive metal nitride layer and/or a metal layer. The sixth upper insulating layer 16 may be formed on the fifth upper insulating layer 15. As an example, the sixth upper insulating layer 16 may be formed of or include silicon oxide. The third interconnection lines 51 and 52 and the fourth interconnection lines 56 may be formed in the sixth upper insulating layer 16. As an example, the third interconnection lines 51 and 52 and the fourth interconnection lines 56 may include a copper layer.

Figure 17:
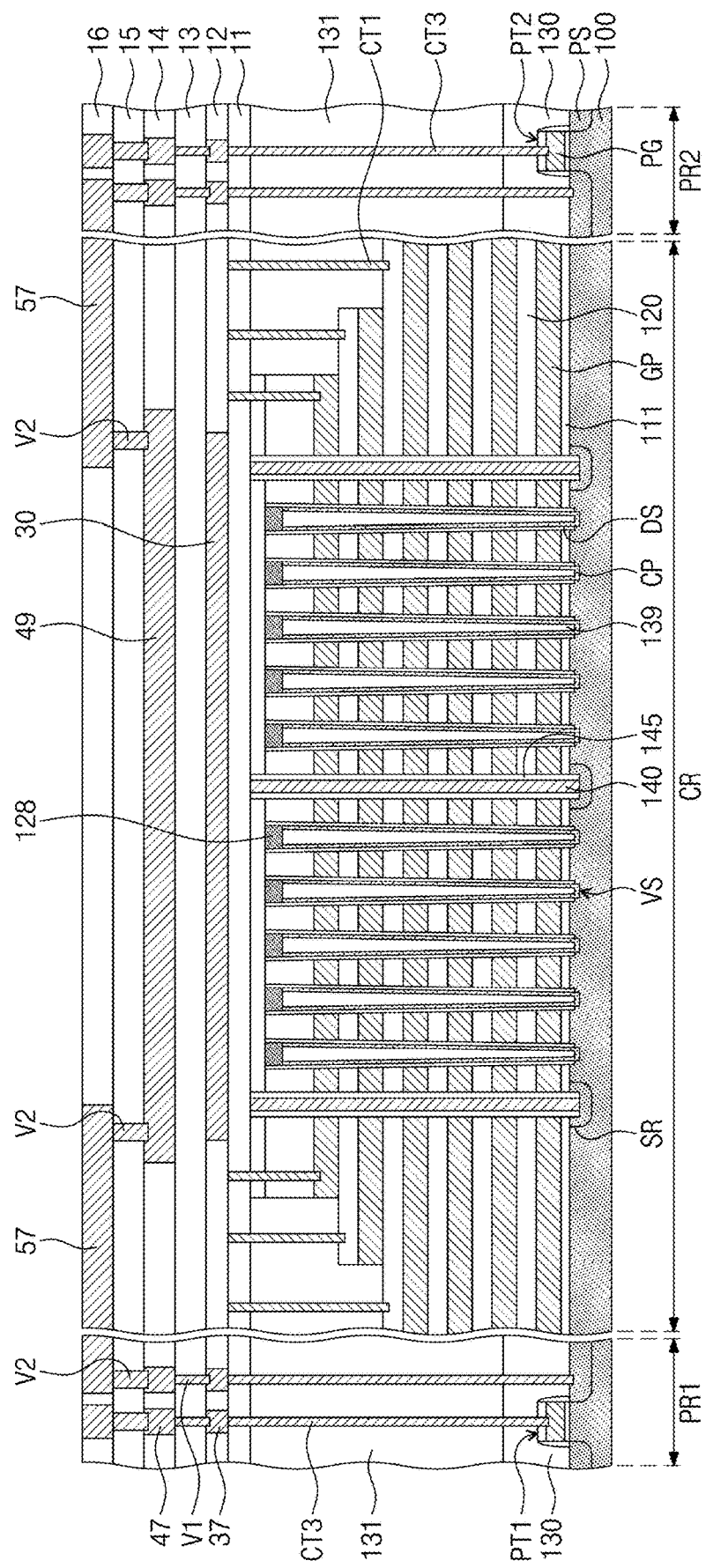
FIG. 17 is a sectional view illustrating a semiconductor memory device according to an embodiment of inventive concepts.

FIG. 17 is a sectional view illustrating a semiconductor memory device according to an embodiment of inventive concepts. For concise description, a previously described element may be identified by the same reference number without repeating an overlapping description thereof. A first peripheral circuit region PR1 and a second peripheral circuit region PR2 may be disposed with the cell array region CR interposed therebetween. The first peripheral circuit region PR1 and the second peripheral circuit region PR2 may be, for example, decoder regions. A first peripheral transistor PT1 may be provided on the first peripheral circuit region PR1, and a second peripheral transistor PT2 may be provided on the second peripheral circuit region PR2. The first peripheral transistor PT1 may be electrically connected to the second peripheral transistor PT2 through an upper interconnection line 57 and a fourth intermediate interconnection line 49. The fourth intermediate interconnection line 49 may be provided on the cell array region CR and may be overlapped with a plurality of the vertical structures VS. The fourth intermediate interconnection line 49 may be connected to the upper interconnection line 57 through the second vias V2. The upper interconnection line 57 may be electrically connected to the first peripheral transistor PT1 and the second peripheral transistor PT2 through the second vias V2, the second peripheral pads 47, the first vias V1, the first peripheral pads 37 and third contacts CT3.

Figure 18:
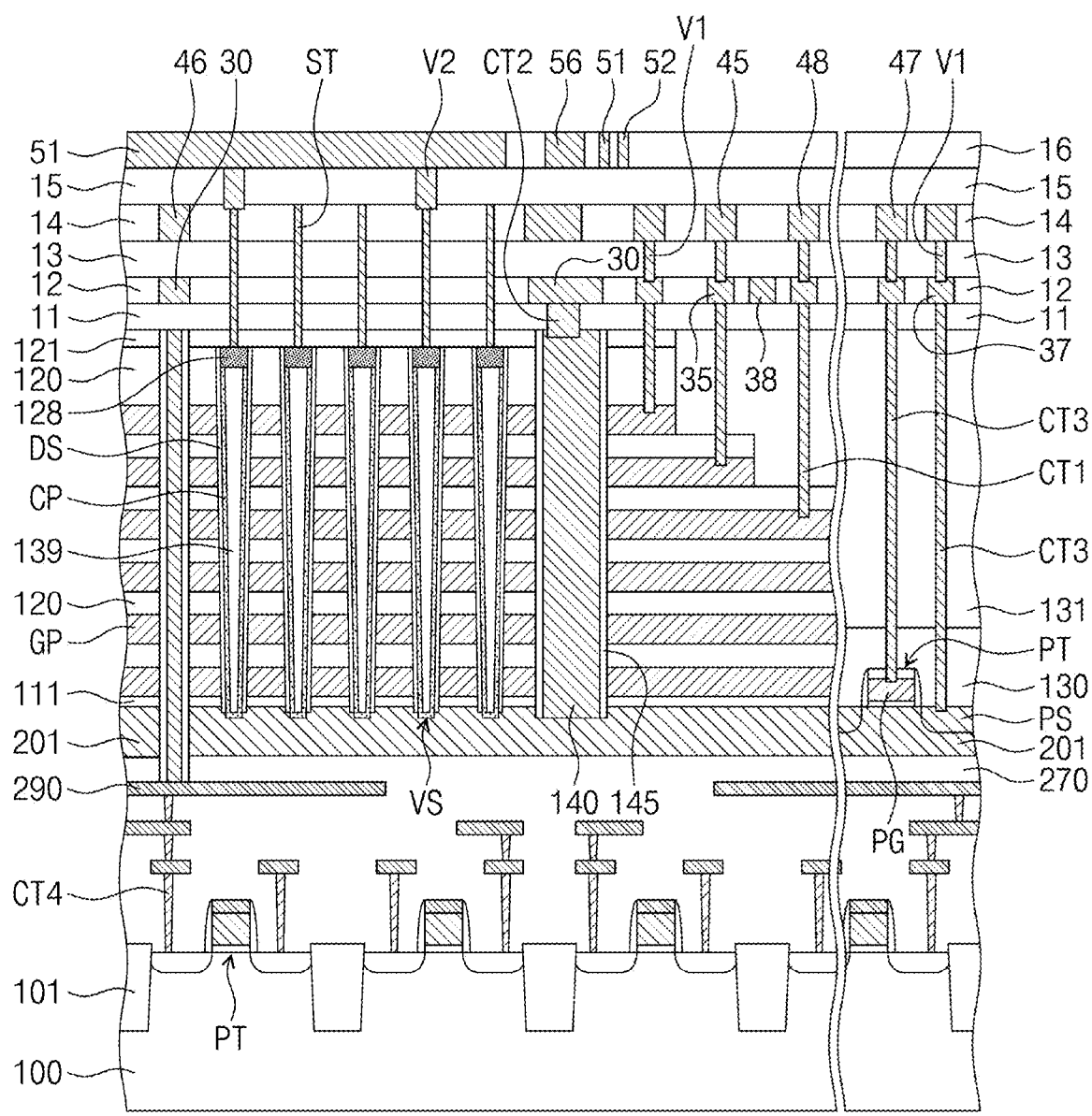
FIG. 18 is a sectional view illustrating a semiconductor memory device according to an embodiment of inventive concepts.

FIG. 18 is a sectional view illustrating a semiconductor memory device according to an embodiment of inventive concepts. In the present embodiment, a cell array region may be provided on a peripheral circuit region. As an example, the horizontal electrodes GP may be provided on an intermediate conductive pattern 201, and the vertical structures VS and the vertical electrodes 140 may be connected to an upper portion of the intermediate conductive pattern 201. A lower insulating layer 270 may be provided between the semiconductor substrate 100 and the intermediate conductive pattern 201, and the peripheral transistors PT may be provided in the lower insulating layer 270. The peripheral transistors PT may be connected to the cell array region through fourth contacts CT4 and peripheral interconnection lines 290. At least one of the vertical electrodes 140 may be provided to penetrate the intermediate conductive pattern 201 and may be connected to the peripheral interconnection lines 290, but inventive concepts are not limited to this example.

According to an embodiment of inventive concepts, interconnection structures, which are configured to easily connect vertical electrodes to each other, may be provided.

While example embodiments of inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
a substrate;
a plurality of electrode structures on the substrate, each of the plurality of electrode structures including horizontal electrodes stacked on each other on the substrate;
vertical electrodes between the electrode structures and extending along the horizontal electrodes;
first contacts connected to the horizontal electrodes at end portions of the plurality of electrode structures;

second contacts connected to upper portions of the vertical electrodes; and a first interconnection structure connected to top surfaces of the second contacts, the first interconnection structure including first sub-interconnection lines and second sub-interconnection lines at a same level over the substrate, the first sub-interconnection lines extending in a first direction and contacting the top surfaces of the second contacts; and the second sub-interconnection lines extending in a second direction crossing the first direction, the second sub-interconnection lines being in contact with the first sub-interconnection lines.

2. The semiconductor memory device of claim 1, wherein the first contacts have top surfaces that are positioned at substantially a same level as the top surfaces of the second contacts.

3. The semiconductor memory device of claim 1, wherein a width of each of the second contacts is greater in the first direction than in the second direction.

4. The semiconductor memory device of claim 1, wherein a separation distance between the second contacts in the first direction is greater than a separation distance between the first contacts in the first direction.

5. The semiconductor memory device of claim 4, wherein the separation distance between the second contacts in the first direction is 10 to 20 times the separation distance between the first contacts in the first direction.

6. The semiconductor memory device of claim 1, wherein the first interconnection structure has a grid shape when viewed in a plan view.

7. The semiconductor memory device of claim 1, further comprising:

vertical structures penetrating the plurality of electrode structures, the vertical structures including channel patterns, wherein the first sub-interconnection lines overlap the horizontal electrodes, and the second sub-interconnection lines overlap with the vertical structures.

8. The semiconductor memory device of claim 1, further comprising:

a second interconnection structure on the first interconnection structure, wherein the second interconnection structure includes third sub-interconnection lines and fourth sub-interconnection lines, the third sub-interconnection lines overlap the first sub-interconnection lines and extend parallel to the first sub-interconnection lines, the fourth sub-interconnection lines overlap the second sub-interconnection lines and extend parallel to the second sub-interconnection lines.

9. The semiconductor memory device of claim 8, further comprising:

first vias connecting the second sub-interconnection lines to the fourth sub-interconnection lines.

10. The semiconductor memory device of claim 8, further comprising:

vertical structures penetrating the plurality of electrode structures; and studs coupled to upper portions of the vertical structures, wherein a top surface of the second interconnection structure is positioned at substantially a same level as top surfaces of the studs.

11. The semiconductor memory device of claim 10, further comprising:

second vias on the second interconnection structure;

third interconnection lines that extend in the second direction and connect to the studs through the second vias; and fourth interconnection lines that extend in the second direction and connect to the second interconnection structure through the second vias, wherein a width of each of the fourth interconnection lines in the first direction is greater than a width of each of the third interconnection lines in the first direction.

12. The semiconductor memory device of claim 1, further comprising:

a peripheral transistor; and third contacts, wherein the semiconductor memory device includes a cell array region and a peripheral circuit region, the plurality of electrode structures are in the cell array region, the peripheral transistor is in the peripheral circuit region, the third contacts are connected to the peripheral transistor, and the third contacts have top surfaces that are positioned at substantially a same level as the top surfaces of the second contacts.

13. The semiconductor memory device of claim 1, wherein the first contacts and the second contacts include spacer patterns enclosing side surfaces thereof.

14. The semiconductor memory device of claim 13, further comprising:

a peripheral transistor;

an interlayered insulating layer covering the peripheral transistor; and third contacts that penetrate the interlayered insulating layer and are connected to the peripheral transistor, wherein the semiconductor memory device includes a cell array region and a peripheral circuit region, the electrode structures are in the cell array region, the peripheral transistor is in the peripheral circuit region, the third contacts include a metal layer and a barrier layer covering a side surface of the metal layer, and the barrier layer contacts the interlayered insulating layer.

15. A semiconductor memory device, comprising:

a substrate;

a plurality of electrode structures on the substrate, each of the plurality of electrode structures including horizontal electrodes stacked on each other on the substrate;

vertical electrodes between the electrode structures and extending along the horizontal electrodes, the vertical electrodes extending in a first direction;

first contacts connected to the horizontal electrodes at end portions of the plurality of electrode structures;

second contacts connected to upper portions of the vertical electrodes, top surfaces of the second contacts being positioned at substantially a same level as top surfaces of the first contacts, and a separation distance between the second contacts in the first direction being greater than a separation distance between the first contacts in the first direction; and a first interconnection structure connected to the top surfaces of the second contacts.

16. The semiconductor memory device of claim 15, wherein the first interconnection structure includes first sub-interconnection lines and second sub-interconnection lines,
the first sub-interconnection lines extend in the first direction and contact with the top surfaces of the second contacts,
the second sub-interconnection lines extend in a second direction that crosses the first direction, and
the second sub-interconnection lines contact the first sub-interconnection lines.

17. The semiconductor memory device of claim 16, further comprising:
a second interconnection structure on the first interconnection structure, wherein
the second interconnection structure includes third sub-interconnection lines and fourth sub-interconnection lines,
the third sub-interconnection lines overlap with the first sub-interconnection lines and are extend parallel to the first sub-interconnection lines, and
the fourth sub-interconnection lines overlap with the second sub-interconnection lines and extend parallel to the second sub-interconnection lines.

18. The semiconductor memory device of claim 15, further comprising:
a peripheral transistor; and
third contacts connected to the peripheral transistor, wherein
the semiconductor memory device includes a cell array region and a peripheral circuit region,
the plurality of electrode structures are in the cell array region,
the peripheral transistor is in the peripheral circuit region, and
the third contacts have top surfaces that are positioned at substantially a same level as the top surfaces of the second contacts.

19. The semiconductor memory device of claim 15, further comprising:
a peripheral transistor;
an interlayered insulating layer covering the peripheral transistor; and
third contacts penetrating the interlayer insulating layer and connecting to the peripheral transistor, wherein
the first contacts and the second contacts include spacer patterns enclosing side surfaces thereof,
the semiconductor memory device includes a cell array region and a peripheral circuit region,
the plurality of electrode structures are in the cell array region,
the peripheral transistor is in the peripheral circuit region,
the third contacts include a metal layer and a barrier layer covering a side surface of the metal layer, and
the barrier layer contacts the interlayered insulating layer.

20. A semiconductor memory device, comprising:
a substrate including a cell array region and a peripheral circuit region;
a plurality of electrode structures on the substrate, each of the plurality of electrode structures including horizontal electrodes stacked on each other on the substrate;
a peripheral transistor in the peripheral circuit region;
vertical structures penetrating the plurality of electrode structures;
studs connected to upper portions of the vertical structures;
vertical electrodes between the plurality of electrode structures, the vertical electrodes extending along the horizontal electrodes and in a first direction;
first contacts connected to the horizontal electrodes at end portions of the plurality of electrode structures;
second contacts connected to upper portions of the vertical electrodes;
extension pads connected to top surfaces of the first contacts;
third contacts connected to the peripheral transistor, top surfaces of the third contacts being positioned at a same level as the top surfaces of the first contacts and top surfaces of the second contacts;
peripheral pads connected to top surfaces of the third contacts;
a first interconnection structure connected to top surfaces of the second contacts, a top surface of the first interconnection structure being positioned at substantially a same level as top surfaces of the extension pads and top surfaces of the peripheral pads; and
a second interconnection structure on the first interconnection structure and connected to the first interconnection structure through first vias, a top surface of the second interconnection structures being positioned at substantially a same level as top surfaces of the studs.

* * * * *